(12) United States Patent
Yamakoshi et al.

(10) Patent No.: US 11,049,869 B2
(45) Date of Patent: Jun. 29, 2021

(54) SEMICONDUCTOR DEVICE WITH RECESS AND METHOD OF MANUFACTURING THE SAME

(71) Applicant: RENESAS ELECTRONICS CORPORATION, Tokyo (JP)

(72) Inventors: Hideaki Yamakoshi, Tokyo (JP); Shinichiro Abe, Tokyo (JP); Takashi Hashimoto, Tokyo (JP); Yuto Omizu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 52 days.

(21) Appl. No.: 16/278,951

(22) Filed: Feb. 19, 2019

(65) Prior Publication Data
US 2019/0279998 A1 Sep. 12, 2019

(30) Foreign Application Priority Data
Mar. 7, 2018 (JP) .............................. JP2018-040609

(51) Int. Cl.
*H01L 27/115* (2017.01)
*H01L 27/11573* (2017.01)
(Continued)

(52) U.S. Cl.
CPC ...... *H01L 27/11573* (2013.01); *H01L 21/266* (2013.01); *H01L 21/26513* (2013.01); *H01L 21/31111* (2013.01); *H01L 21/31144* (2013.01); *H01L 21/76283* (2013.01); *H01L 21/84* (2013.01); *H01L 27/0207* (2013.01); *H01L 27/11568* (2013.01); *H01L 27/1207* (2013.01);
(Continued)

(58) Field of Classification Search
CPC .................................................. H01L 27/11573
See application file for complete search history.

(56) References Cited

U.S. PATENT DOCUMENTS 9,935,125 B2 4/2018 Tsunomura et al.
2001/0021545 A1* 9/2001 Houlihan ........ H01L 21/823878
438/199
(Continued)

FOREIGN PATENT DOCUMENTS

JP 2013-219181 A 10/2013

*Primary Examiner* — Thao X Le
*Assistant Examiner* — Laura M Dykes
(74) *Attorney, Agent, or Firm* — McDermott Will & Emery LLP

(57) ABSTRACT

A MONOS transistor as a first transistor can have improved reliability and a change in channel-width dependence of the property of a second transistor can be suppressed. The semiconductor device according to one embodiment includes a semiconductor substrate having first and second regions on the first main surface, an insulating film on the second region, a semiconductor layer on the insulating film, a memory transistor region in the first region, a first transistor region in the second main surface of the semiconductor layer, a first element isolation film surrounding the memory transistor region, and a second element isolation film surrounding the first transistor region. A first recess depth between the bottom of the first recess and the first main surface in the memory transistor region is larger than a second recess depth between the bottom of a second recess and the second main surface in the first transistor region.

7 Claims, 24 Drawing Sheets

(51) Int. Cl.

| | |
|---|---|
| *H01L 27/11568* | (2017.01) |
| *H01L 29/66* | (2006.01) |
| *H01L 21/762* | (2006.01) |
| *H01L 21/311* | (2006.01) |
| *H01L 21/266* | (2006.01) |
| *H01L 21/265* | (2006.01) |
| *H01L 29/10* | (2006.01) |
| *H01L 29/792* | (2006.01) |
| *H01L 27/02* | (2006.01) |
| *H01L 27/12* | (2006.01) |
| *H01L 21/84* | (2006.01) |
| *H01L 21/027* | (2006.01) |
| *H01L 29/08* | (2006.01) |
| *H01L 29/49* | (2006.01) |
| *H01L 21/02* | (2006.01) |
| *H01L 21/3065* | (2006.01) |

(52) U.S. Cl.
CPC ...... *H01L 29/1033* (2013.01); *H01L 29/1095* (2013.01); *H01L 29/66568* (2013.01); *H01L 29/66833* (2013.01); *H01L 29/792* (2013.01); H01L 21/0273 (2013.01); H01L 21/02164 (2013.01); H01L 21/02271 (2013.01); H01L 21/3065 (2013.01); H01L 21/31116 (2013.01); H01L 29/0847 (2013.01); H01L 29/4916 (2013.01); H01L 29/6656 (2013.01)

(56) References Cited

U.S. PATENT DOCUMENTS

2013/0087855 A1* 4/2013 Makiyama ........ H01L 21/76283 257/350
2013/0140669 A1* 6/2013 Yugami ............ H01L 21/76229 257/506
2014/0353756 A1* 12/2014 Yamamoto ........ H01L 21/76283 257/351

* cited by examiner

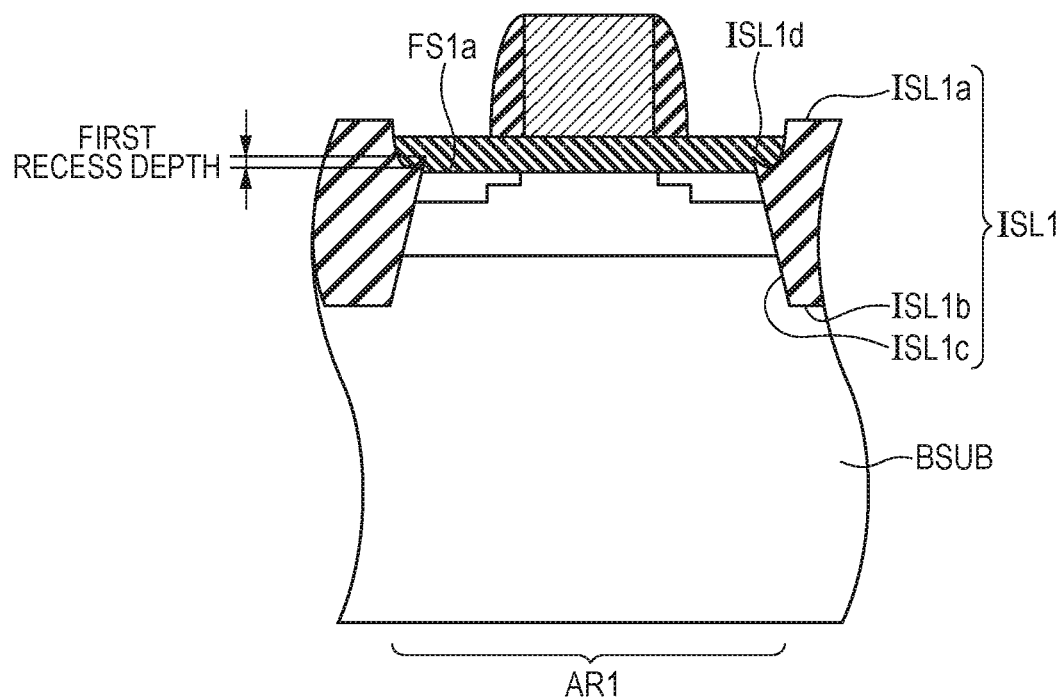
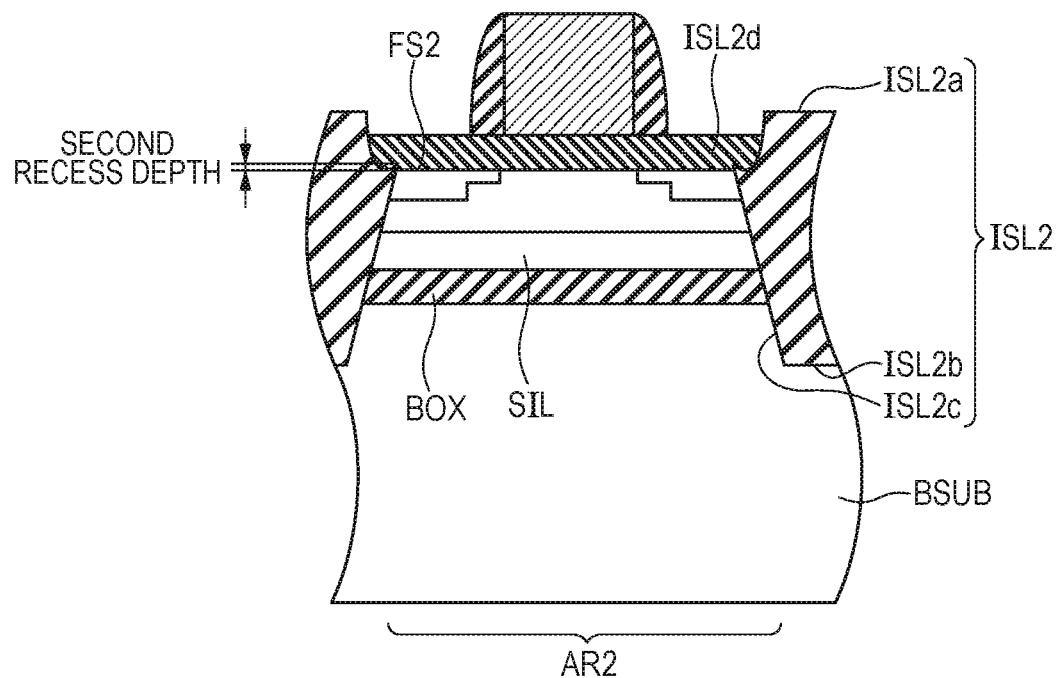

EFFECTIVE CHANNEL WIDTH: NARROW

EFFECTIVE CHANNEL WIDTH: WIDE

SEMICONDUCTOR DEVICE WITH RECESS AND METHOD OF MANUFACTURING THE SAME

CROSS-REFERENCE TO RELATED APPLICATIONS

The disclosure of Japanese Patent Application No. 2018-040609 filed on Mar. 7, 2018 including the specification, drawings and abstract is incorporated herein by reference in its entirety.

BACKGROUND

The present invention relates to a semiconductor device and a method of manufacturing the same.

The semiconductor device described in Patent Document 1 (Japanese Unexamined Patent Application Publication No. 2013-219181) is conventionally known. The semiconductor device described in Patent Document 1 has a support substrate, a BOX (buried oxide) film, an SOI substrate having an SOI (silicon on insulator) layer, and an STI (shallow trench isolation).

The support substrate has a first main surface including an SOI region and a bulk silicon region. The BOX film is placed on the first main surface situated in the SOI region. An element isolation region is, for example, an STI (shallow trench isolation). The STI is placed to separate the SOI region and the bulk silicon region from each other.
[Patent Document 1] Japanese Unexamined Patent Application Publication No. 2013-219181

SUMMARY

In the semiconductor device described in Patent Document 1, the SOI substrate is formed by removing the BOX film and the SOI layer placed on the first main surface lying in the bulk silicon region. In the semiconductor device described in Patent Document 1, therefore, the upper surface of the STI is higher than the first main surface lying in the element isolation region and the bulk silicon region (is reversely recessed).

When a MONOS (metal oxide nitride oxide silicon) transistor is formed on the first main surface lying in the bulk silicon region, a recess is preferably formed at the end portion of the STI situated on the side of an active region in which the MONOS transistor is to be formed, from the standpoint of keeping the reliability (retention property) of the MONOS transistor. In short, the STI is preferably recessed, at the end portion thereof situated on the side of an active region in which the MONOS transistor is to be formed.

Such a recess can be formed by etching the whole surface of the SOI substrate with a chemical solution such as hydrofluoric acid (HF) capable of etching a silicon oxide film. This method however forms a similar recess also at the end portion of the STI situated on the side of the SOI layer. Such a recess formed at the end portion of the STI situated on the side of the SOI layer inevitably changes the channel-width dependence of the property of a transistor to be formed in the SOI layer.

Another problem and a novel feature will be apparent from the description herein and accompanying drawings.

A semiconductor device according to one embodiment is equipped with: a semiconductor substrate having, on a first main surface thereof, a first region and a second region; an insulating film formed on the second region of the first main surface; a semiconductor layer formed on the insulating film; a memory transistor region formed in the first region of the first main surface; a first transistor region formed on a second main surface of the semiconductor layer; a first element isolation film surrounding the memory transistor region and having a first upper surface and a first bottom surface opposite to the first upper surface; and a second element isolation film surrounding the first transistor region and having a second upper surface and a second bottom surface opposite to the second upper surface. The semiconductor device has, at the end portion of the first upper surface on the side of the memory transistor region, a first recess recessed from the first upper surface to the first bottom surface. It has, at the end portion of the second upper surface on the side of the first transistor region, a second recess recessed from the second upper surface to the second bottom surface. A first recess depth which is a distance between the bottom of the first recess and the first main surface lying in the memory transistor region is larger than a second recess depth which is a distance between the bottom of the second recess and the second main surface lying in the first transistor region.

The semiconductor device of the embodiment can suppress variations in channel-width dependence of the property of the second transistor while improving the reliability of the first transistor serving as a MONOS transistor.

BRIEF DESCRIPTION OF THE DRAWINGS

FIG. 3 is an enlarged cross-sectional view of the semiconductor device according to First Embodiment in the memory transistor region AR1;

FIG. 4 is an enlarged cross-sectional view of the semiconductor device according to First Embodiment in the first transistor region AR2;

DETAILED DESCRIPTION

Figure 1:
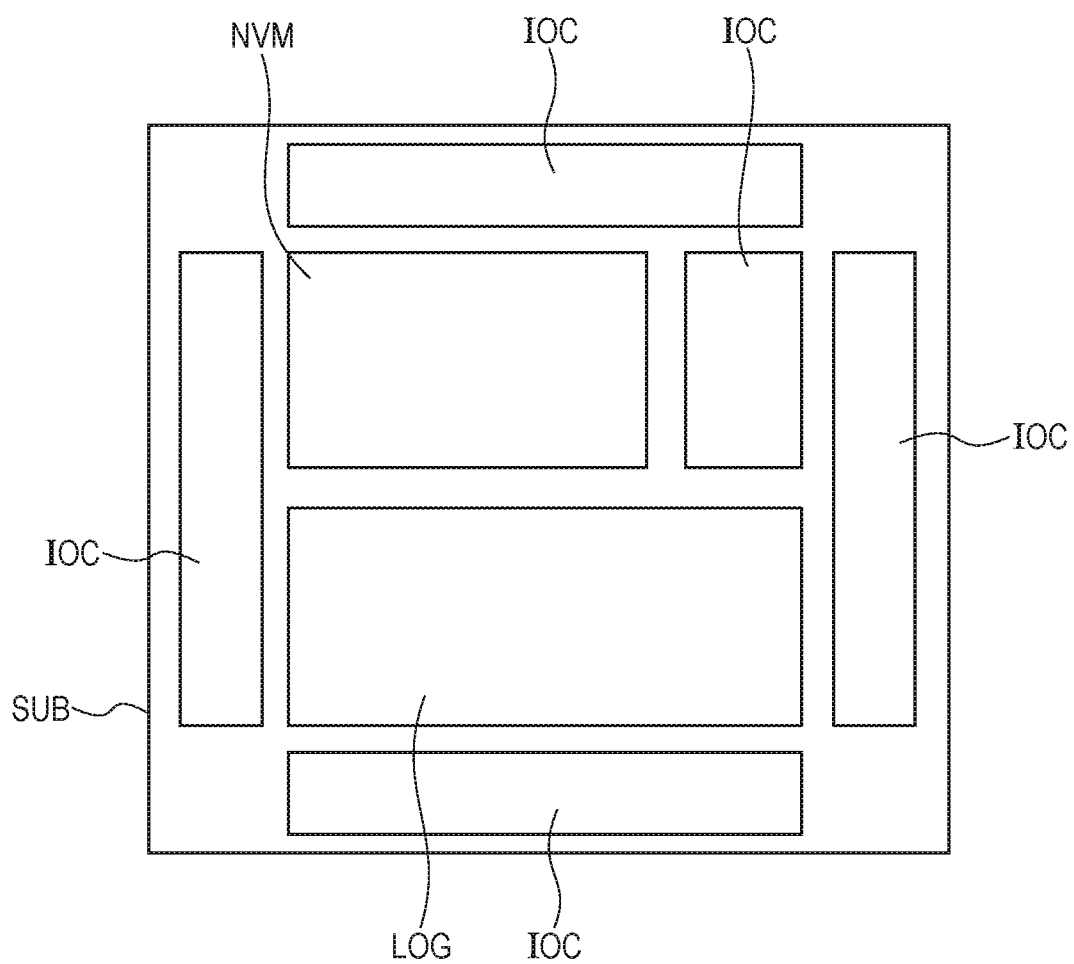
FIG. 1 shows a schematic layout of a semiconductor device according to First Embodiment.

Details of the embodiments will be described referring to drawings. In the following drawings, a portion which is the same as that described before or a portion corresponding thereto will be identified by the same reference numeral and an overlapping description will be omitted.

Configuration of Semiconductor Device According to First Embodiment

The configuration of the semiconductor device according to First Embodiment will hereinafter be described.

As shown in FIG. 1, the semiconductor device according to First Embodiment has a nonvolatile memory circuit NVM, a logic circuit LOG, and an input/output circuit IOC.

The nonvolatile memory circuit NVM is comprised of a plurality of first transistors Tr1 and a plurality of third transistors Tr3. The first transistor Tr1 is a MONOS transistor, while the third transistor Tr3 is a select transistor for selecting the first transistor.

The logic circuit is, for example, a CPU (central processing unit) or the like. The logic circuit LOG is comprised of a second transistor Tr2. More specifically, the logic circuit LOG is comprised of a CMOS (complementary metal oxide semiconductor) circuit having an n type second transistor Tr2 and a p type second transistor Tr2 in combination. The input/output circuit IOC is comprised of a fourth transistor Tr4.

The semiconductor device according to First Embodiment has a SOI substrate SUB. The SOI substrate SUB has thereon the first transistor Tr1, the second transistor Tr2, the third transistor Tr3, and the fourth transistor Tr4.

The transistors (that is, the first transistor Tr1 and the third transistor Tr3) configuring the nonvolatile memory circuit NVM are in the first region FS1a. The transistor (that is, the second transistor Tr2) configuring the logic circuit LOG is on a surface FS2. The transistor (that is, the fourth transistor Tr4) configuring the input/output circuit is placed in the first region FS1a.

Figure 2:
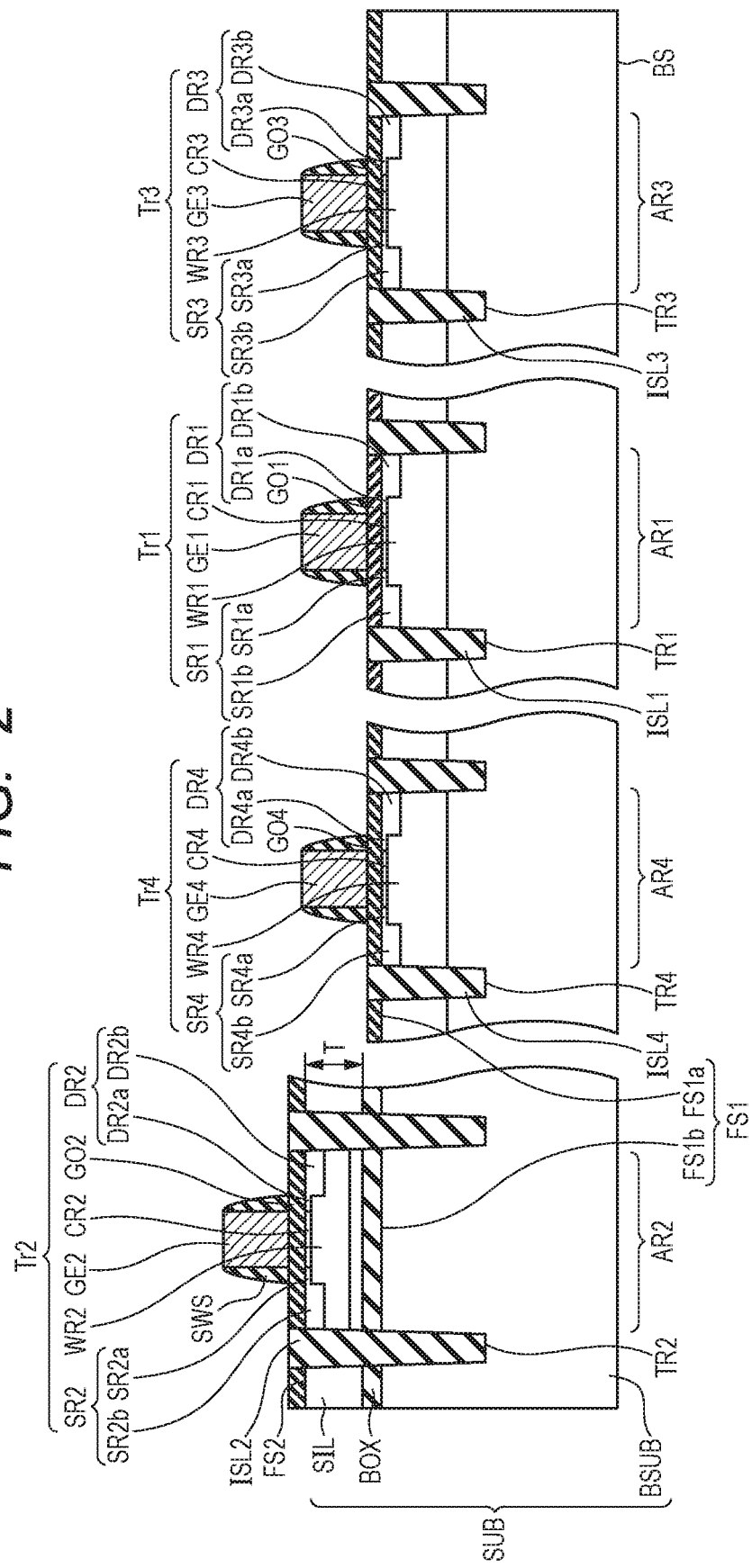
FIG. 2 is a cross-sectional view of the semiconductor device according to First Embodiment.

As shown in FIG. 2, the SOI substrate SUB has a semiconductor substrate BSUB, an insulating film BOX, and a semiconductor layer SIL.

The semiconductor substrate BSUB is made of, for example, silicon (Si) single crystal. The insulating film BOX is made of, for example, silicon dioxide ($SiO_2$). The semiconductor layer SIL is made of, for example, silicon single crystal. The semiconductor substrate BSUB has a surface FS1 (first main surface) and a back surface BS. The surface FS1 has a first region FS1a and a second region FS1b. The back surface is a surface opposite to the surface FS1.

The semiconductor substrate BSUB has thereon the semiconductor layer SIL and the insulating film BOX. More specifically, the insulating film BOX is on the second region FS1b. The semiconductor layer SIL is on the insulating film BOX. The semiconductor layer SIL has a surface FS2 (second main surface). The semiconductor layer SIL has Thickness T.

The SOI substrate SUB has therein a trench TR1, a trench TR2, a trench TR3, and a trench TR4. More specifically, the trench TR1, the trench TR3, and the trench TR4 are in the first region FS1a and the trench TR2 is in the surface FS2. The trench TR1, the trench TR3, and the trench TR4 each extend from the surface FS1 to the back surface BS. The trench TR2 extends from the surface FS2 to the semiconductor substrate BSUB. The bottom surface of the trench TR2 reaches the semiconductor substrate BSUB.

The semiconductor device according to First Embodiment has a first element isolation film ISL1, a second element isolation film ISL2, a third element isolation film ISL3, and a fourth element isolation film ISL4. The first element isolation film ISL1, the third element isolation film ISL3, and the fourth element isolation film ISL4 lie in the semiconductor substrate BSUB. The second element isolation film ISL2 lies in the semiconductor layer SIL. More specifically, the first element isolation film ISL1, the third element isolation film ISL3, and the fourth element isolation film ISL4 are placed in the first region FS1a and the second element isolation film ISL2 is placed in the surface FS2.

From another standpoint, the first element isolation film ISL1, the second element isolation film ISL2, the third element isolation film ISL3, and the fourth element isolation film ISL4 are buried in the trench TR1, the trench TR2, the trench TR3, and the trench TR4, respectively.

As shown in FIG. 3, the first element isolation film ISL1 has an upper surface ISL1a, a bottom surface ISL1b, and a side surface ISL1c. The bottom surface ISL1b is a surface opposite to the upper surface ISL1a. The side surface ISL1c lies on the side of the memory transistor region AR1. The side surface ISL1c is inclined, at an acute angle, to the surface FS1 lying in the memory transistor region AR1. In other words, the first element isolation film ISL1 has a gradually decreasing width from the side of the upper surface ISL1a to the side of the bottom surface ISL1b. The upper surface ISL1a has a recess ISL1d. The recess ISL1d is situated at an end portion of the upper surface ISL1a on the side of the side surface ISL1c. In the recess ISL1d, the upper surface ISL1a is recessed toward the side of the bottom surface ISL1b.

As shown in FIG. 4, the second element isolation film ISL2 has an upper surface ISL2a, a bottom surface ISL2b, and a side surface ISL2c. The bottom surface ISL2b is a surface opposite to the upper surface ISL2a. The side surface ISL2c lies on the side of the first transistor region AR2. The side surface ISL2c is inclined at an acute angle to the surface FS2 lying in the first transistor region AR2. This means that the second element isolation film ISL2 has a gradually decreasing width from the side of the upper surface ISL2a toward the side of the bottom surface ISL2b. The upper surface ISL2a has a recess ISL2d. The recess ISL2d is situated at the end portion of the upper surface ISL2a on the side of the side surface ISL2c. In the recess ISL2d, the upper surface ISL2a is recessed toward the side of the bottom surface ISL2b.

Figure 5:
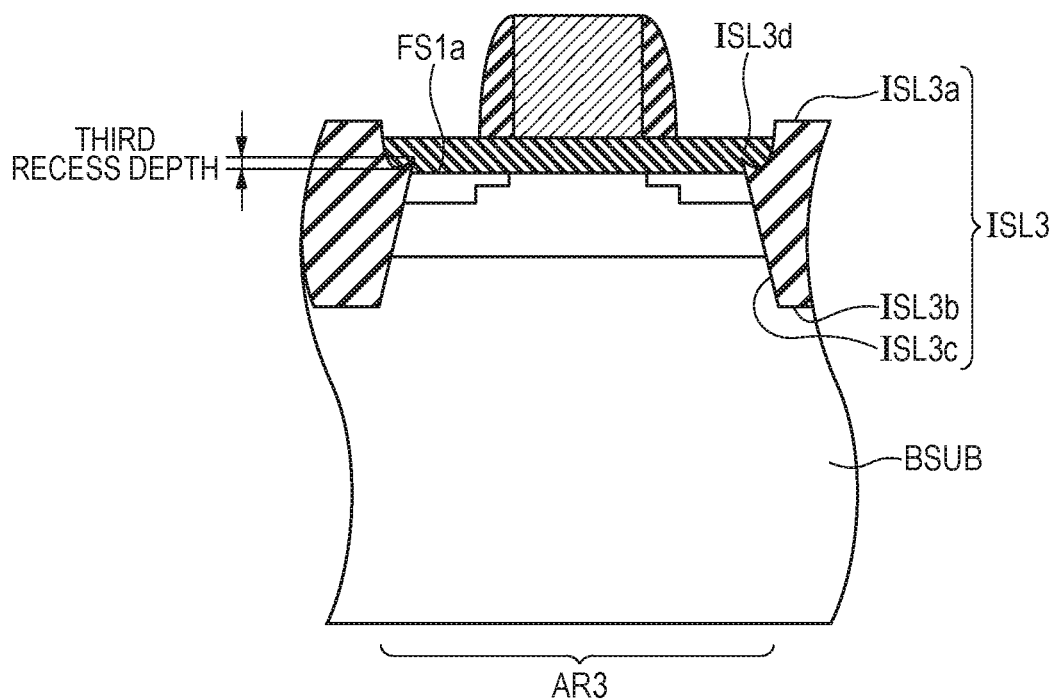
FIG. 5 is an enlarged cross-sectional view of the semiconductor device according to First Embodiment in the second transistor region AR3.

As shown in FIG. 5, the third element isolation film ISL3 has an upper surface ISL3a, a bottom surface ISL3b, and a side surface ISL3c. The bottom surface ISL3b is a surface opposite to the upper surface ISL3a. The side surface ISL3c lies on the side of the second transistor region AR3. The side surface ISL3c is inclined at an acute angle to the surface FS1 lying in the second transistor region AR3. This means that the third element isolation film ISL3 has a gradually decreasing width from the side of the upper surface ISL3a toward the side of the bottom surface ISL3b. The upper surface ISL3a has a recess ISL3d. The recess ISL3d is situated at the end portion of the upper surface ISL3a on the side of the side surface ISL3c. In the recess ISL3d, the upper surface ISL3a is recessed toward the side of the bottom surface ISL3b.

Figure 6:
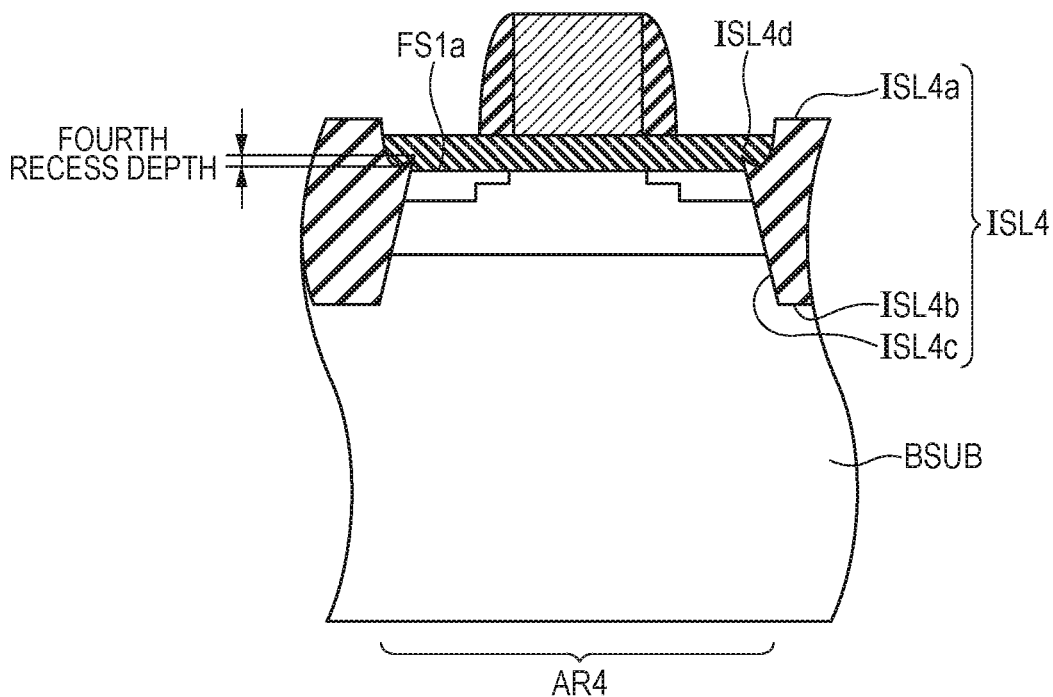
FIG. 6 is an enlarged cross-sectional view of the semiconductor device according to First Embodiment in the third transistor region AR4.

As shown in FIG. 6, the fourth element isolation film ISL4 has an upper surface ISL4a, a bottom surface ISL4b, and a side surface ISL4c. The bottom surface ISL4b is a surface opposite to the upper surface ISL4a. The side surface ISL4c lies on the side of the third transistor region AR4. The side surface ISL4c is inclined at an acute angle to the surface FS1 lying in the third transistor region AR4. This means that the fourth element isolation film ISL4 has a gradually decreasing width from the side of the upper surface ISL4a toward the side of the bottom surface ISL4b. The upper surface ISL4a has a recess ISL4d. The recess ISL4d is situated at the end portion of the upper surface ISL4a on the side of the side surface ISL4c. In the recess ISL4d, the upper surface ISL4a is recessed toward the side of the bottom surface ISL4b.

The first region FS1a has therein the memory transistor region AR1, the second transistor region AR3, and the third transistor region AR4. In the memory transistor region AR1, the second transistor region AR3, and the third transistor region AR4, the first transistor Tr1, the third transistor Tr3, and the fourth transistor Tr4 will be formed, respectively.

The surface FS2 has thereon the first transistor region AR2. In the first transistor region AR2, the second transistor Tr2 will be formed.

The memory transistor region AR1 is, in plan view, surrounded by the first element isolation film ISL1. The first transistor region AR2 is, in plan view, surrounded by the second element isolation film ISL2. The second transistor region AR3 is, in plan view, surrounded by the third element isolation film ISL3. The third transistor region AR4 is, in plan view, surrounded by the fourth element isolation film ISL4.

The distance between the bottom of the recess ISL1d and the surface FS1 lying in the memory transistor region AR1 will hereinafter be called "first recess depth" (refer to FIG. 3). The distance between the bottom of the recess ISL2d and the surface FS2 lying in the first transistor region AR2 will hereinafter be called "second recess depth" (refer to FIG. 4). The first recess depth is larger than the second recess depth. When the bottom of the recess ISL2d is above the surface FS2 lying in the first transistor region AR2, the second recess depth indicates a negative value.

The distance between the bottom of the recess ISL3d and the surface FS1 lying in the second transistor region AR3 will hereinafter be called a "third recess depth" (refer to FIG. 5). It is preferred that the third recess depth is smaller than the first recess depth, but larger than the second recess depth. The distance between the bottom of the recess ISL4d and the surface FS1 lying in the third transistor region AR4 will hereinafter be called a "fourth recess depth" (refer to FIG. 6). It is preferred that the fourth recess depth is smaller than the third recess depth and is larger than the second recess depth. The fourth recess depth is preferably not larger than Thickness T. The third recess depth is preferably equal to or larger than Thickness T.

From another standpoint, the first recess depth, the second recess depth, the third recess depth, and the fourth recess depth preferably satisfy the following relationship: second recess depth<fourth recess depth≤Thickness T≤third recess depth<first recess depth.

The first recess depth and the third recess depth each fall within a range of, for example, from 20 nm or more to 30 nm or less. The second recess depth and the fourth recess depth each fall within a range of from several nm or more to Thickness T or less.

The semiconductor substrate BSUB has a source region SR1, a drain region DR1, and a well region WR1. The well region WR1 includes the channel region CR1. The source region SR1 and the drain region DR1 have a conductivity type opposite to that of the well region WR1 (channel region CR1).

The source region SR1 and the drain region DR1 are formed in the surface FS1 lying in the memory transistor region AR1. The source region SR1 and the drain region DR1 are separated from each other. The well region WR1 is formed in the surface FS1 in the memory transistor region AR1 so as to surround the source region SR1 and the drain region DR1. A portion of the well region WR1 sandwiched between the source region SR1 and the drain region DR1 becomes the channel region CR1.

The source region SR1 has a first portion SR1a and a second portion SR1b. The first portion SR1a is placed closer to the channel region CR1 than the second portion SR1b is. The first portion SR1a has an impurity concentration lower than that of the second portion SR1b. In other words, the source region SR1 has an LDD (lightly doped diffusion) structure.

The drain region DR1 has a first portion DR1a and a second portion DR1b. The first portion DR1a is placed closer to the channel region CR1 than the second portion DR1b is. The first portion DR1a has an impurity concentration lower than that of the second portion DR1b. In other words, the source region DR1 has an LDD structure.

The semiconductor substrate BSUB has a source region SR3, a drain region DR3, and a well region WR3. The well region WR3 includes a channel region CR3. The source region SR3 and the drain region DR3 have a conductivity type opposite to that of the well region WR3 (channel region CR3).

The source region SR3 and the drain region DR3 are formed in the surface FS1 in the second transistor region AR3. The source region SR3 and the drain region DR3 are separated from each other. The well region WR3 is formed in the surface FS1 in the second transistor region AR3 so as to surround the source region SR3 and the drain region DR3. A portion of the well region WR3 sandwiched between the source region SR3 and the drain region DR3 is a channel region CR3.

The source region SR3 has a first portion SR3a and a second portion SR3b. The first portion SR3a is placed closer to the channel region CR3 than the second portion SR3b is. The first portion SR3a has an impurity concentration lower than that of the second portion SR3b. In other words, the source region SR3 has an LDD structure.

The drain region DR3 has a first portion DR3a and a second portion DR3b. The first portion DR3a is placed closer to the channel region CR3 than the second portion DR3b is. The first portion DR3a has an impurity concentration lower than that of the second portion DR3b. In other words, the source region DR3 has an LDD structure.

The semiconductor substrate BSUB has a source region SR4, a drain region DR4, and a well region WR4. The well region WR4 includes the channel region CR4. The source region SR4 and the drain region DR4 have a conductivity type opposite to the conductivity type of the well region WR4 (channel region CR4). The source region SR4 and the drain region DR4 are formed in the surface FS1 in the third transistor region AR4. The source region SR4 and the drain region DR4 are separated from each other. The well region WR4 is formed in the surface FS1 in the third transistor region AR4 so as to surround the source region SR4 and the rain region DR4. A portion of the well region WR4 sandwiched between the source region SR4 and the drain region DR4 is a channel region CR4.

The source region SR4 has a first portion SR4a and a second portion SR4b. The first portion SR4a is placed closer to the channel region CR4 than the second portion SR4b is. The first portion SR4a has an impurity concentration lower than that of the second portion SR4b. In other words, the source region SR4 has an LDD structure.

The drain region DR4 has a first portion DR4a and a second portion DR4b. The first portion DR4a is closer to the channel region CR4 than the second portion DR4b is. The first portion DR4a has an impurity concentration lower than that of the second portion DR4b. In other words, the source region DR4 has an LDD structure.

The semiconductor layer SIL has a source region SR2, a drain region DR2, and a well region WR2. The well region WR2 includes a channel region CR2. The source region SR2 and the drain region DR2 have a conductivity type opposite to that of the well region WR2 (channel region CR2).

The source region SR2 and the drain region DR2 are formed in the surface FS2 in the first transistor region AR2. The source region SR2 and the drain region DR2 are separated from each other. The well region WR2 is formed in the surface FS2 in the first transistor region AR2 so as to surround the source region SR2 and the drain region DR2. A portion of the well region WR2 sandwiched between the source region SR2 and the drain region DR2 is a channel region CR2.

The source region SR2 has a first portion SR2a and a second portion SR2b. The first portion SR2a is closer to the channel region CR2 than the second portion SR2b is. The first portion SR2a has an impurity concentration lower than that of the second portion SR2b. In other words, the source region SR2 has an LDD structure.

The drain region DR2 has a first portion DR2a and a second portion DR2b. The first portion DR2a is closer to the channel region CR2 than the second portion DR2b is. The first portion DR2a has an impurity concentration lower than that of the second portion DR2b. In other words, the drain region DR2 has an LDD structure.

The semiconductor device according to First Embodiment has a first gate insulating film GO1, a second gate insulating film GO2, a third gate insulating film GO3, and a fourth gate insulating film GO4.

The first gate insulating film GO1 is formed on the memory transistor region AR1. More specifically, the first gate insulating film GO1 is on the well region WR1 (channel region CR1) sandwiched between the source region SR1 and the drain region DR1.

More specifically, the first gate insulating film GO1 is a stacked film comprised of a first oxide film formed on the memory transistor region AR1, a nitride film formed on the first oxide film, and a second oxide film formed on the nitride film. In other words, the first gate insulating film GO1 is an ONO (oxide nitride oxide) film. The first oxide film and the second oxide film are each made of, for example, silicon dioxide. The nitride film is made of, for example, silicon nitride ($Si_3N_4$).

The second gate insulating film GO2 is formed on the first transistor region AR2. More specifically, the second gate insulating film GO2 is formed on the well region WR2 (channel region CR2) sandwiched between the source region SR2 and the drain region DR2.

The second gate insulating film GO2 is made of, for example, silicon dioxide. The second gate insulating film GO2 may contain an element, such as hafnium (Hf), for enhancing a dielectric constant.

The third gate insulating film GO3 is formed on the second transistor region AR3. More specifically, the third gate insulating film GO3 is formed on the well region WR3 (channel region CR3) sandwiched between the source region SR3 and the drain region DR3.

The fourth gate insulating film GO4 is formed on the third transistor region AR4. More specifically, the fourth gate insulating film GO4 is formed on the well region WR4 (channel region CR4) sandwiched between the source region SR4 and the drain region DR4. The third gate insulating film GO3 and the fourth gate insulating film GO4 are each made of, for example, silicon dioxide.

The semiconductor device according to First Embodiment has a gate electrode GE1, a gate electrode GE2, a gate electrode GE3, and a gate electrode GE4. The gate electrode GE1 is formed on the first gate insulating film GO1. The gate electrode GE2 is formed on the second gate insulating film GO2. The gate electrode GE3 is formed on the third gate insulating film GO3. The gate electrode GE4 is formed on the fourth gate insulating film GO4. The gate electrode GE1, the gate electrode GE2, the gate electrode GE3, and the gate electrode GE4 are each made of, for example, impurity-doped polycrystalline silicon.

The first transistor Tr1 is comprised of the source region SR1, the drain region DR1, the well region WR1 (channel region CR1), the first gate insulating film GO1, and the gate electrode GE1. The second transistor Tr2 is comprised of the source region SR2, the drain region DR2, the well region WR2 (channel region CR2), the second gate insulating film GO2, and the gate electrode GE2.

The third transistor Tr3 is comprised of the source region SR3, the drain region DR3, the well region WR3 (channel region CR3), the third gate insulating film GO3, and the gate electrode GE3. The fourth transistor Tr4 is comprised of the source region SR4, the drain region DR4, the well region WR4 (channel region CR4), the fourth gate insulating film GO4, and the gate electrode GE4.

The semiconductor device according to First Embodiment has a sidewall spacer SWS. The sidewall spacer SWS is formed on the side of the gate electrode GE1 (the gate electrode GE2, the gate electrode GE3, and the gate electrode GE4) and on the first portion SR1a and the first portion DR1a (the first portion SR2a and the first portion DR2a, the first portion SR3a and the first portion DR3a, and the first portion SR4a and the first portion DR4a). The sidewall spacers SWS are each made of, for example, silicon dioxide or silicon nitride.

Method of Manufacturing Semiconductor Device According to First Embodiment

A method of manufacturing a semiconductor device according to First Embodiment will hereinafter be described.

Figure 7:
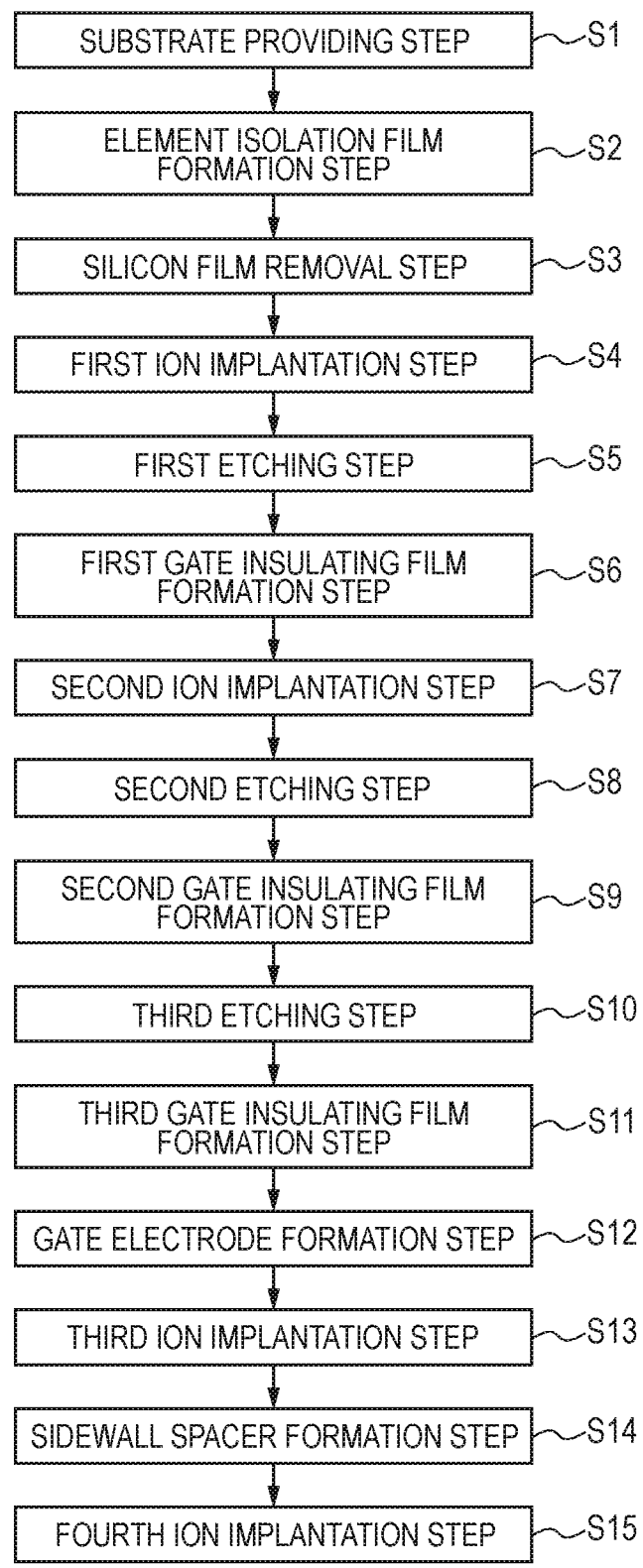
FIG. 7 is a flow chart showing a method of manufacturing the semiconductor device according to First Embodiment.

As shown in FIG. 7, the method of manufacturing a semiconductor device according to First Embodiment has a substrate providing step S1, an element isolation film formation step S2, a semiconductor layer removal step S3, and a first ion implantation step S4.

The method of manufacturing a semiconductor device according to First Embodiment further has a first etching step S5, a first gate insulating film formation step S6, a second ion implantation step S7, a second etching step S8, and a second gate insulating film formation step S9.

The method of manufacturing a semiconductor device according to First Embodiment still further has a third etching step S10, a third gate insulating film formation step S11, a gate electrode formation step S12, a third ion implantation step S13, a sidewall spacer formation step S14, and a fourth ion implantation step S15.

Figure 8:
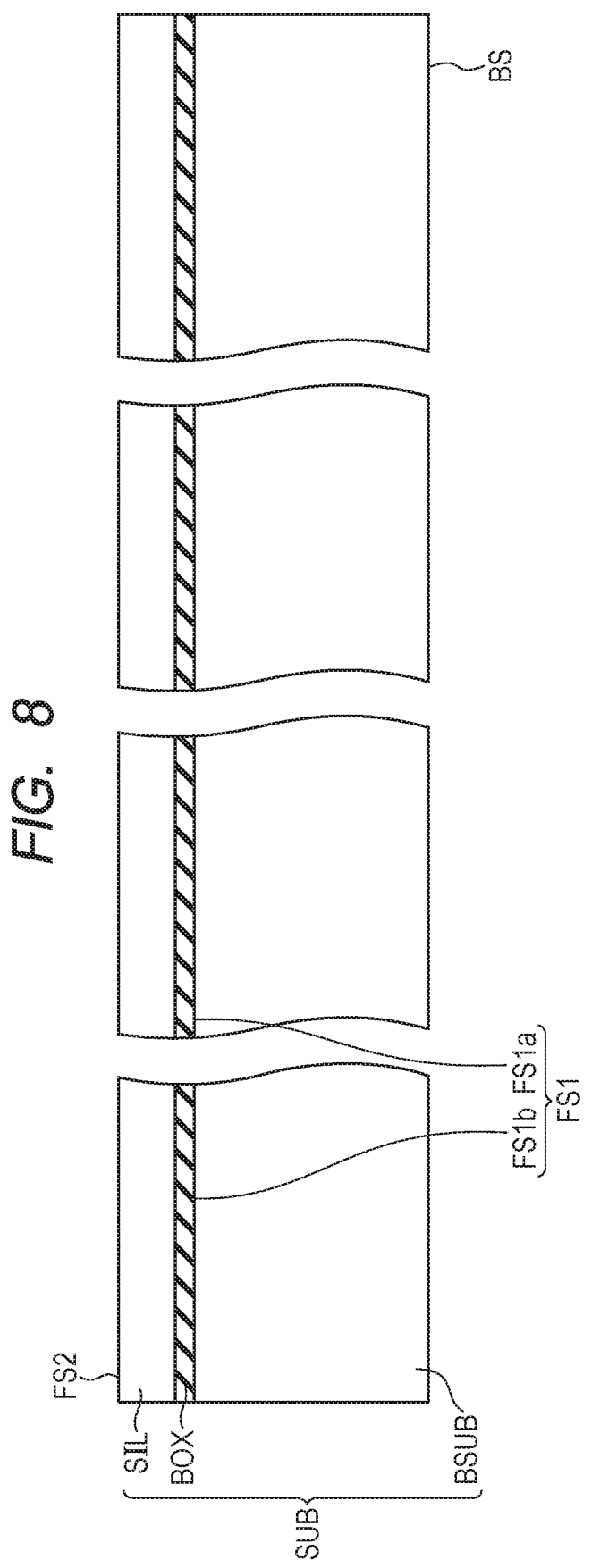
FIG. 8 is a cross-sectional view of the semiconductor device according to First Embodiment in the substrate providing step S1.

As shown in FIG. 8, in the substrate providing step S1, a SOI substrate SUB is provided. The SOI substrate SUB provided in the substrate providing step S1 has an insulating film BOX all over the surface FS1 on the semiconductor substrate BSUB. The semiconductor layer SIL is placed on the insulating film BOX.

Figure 9:
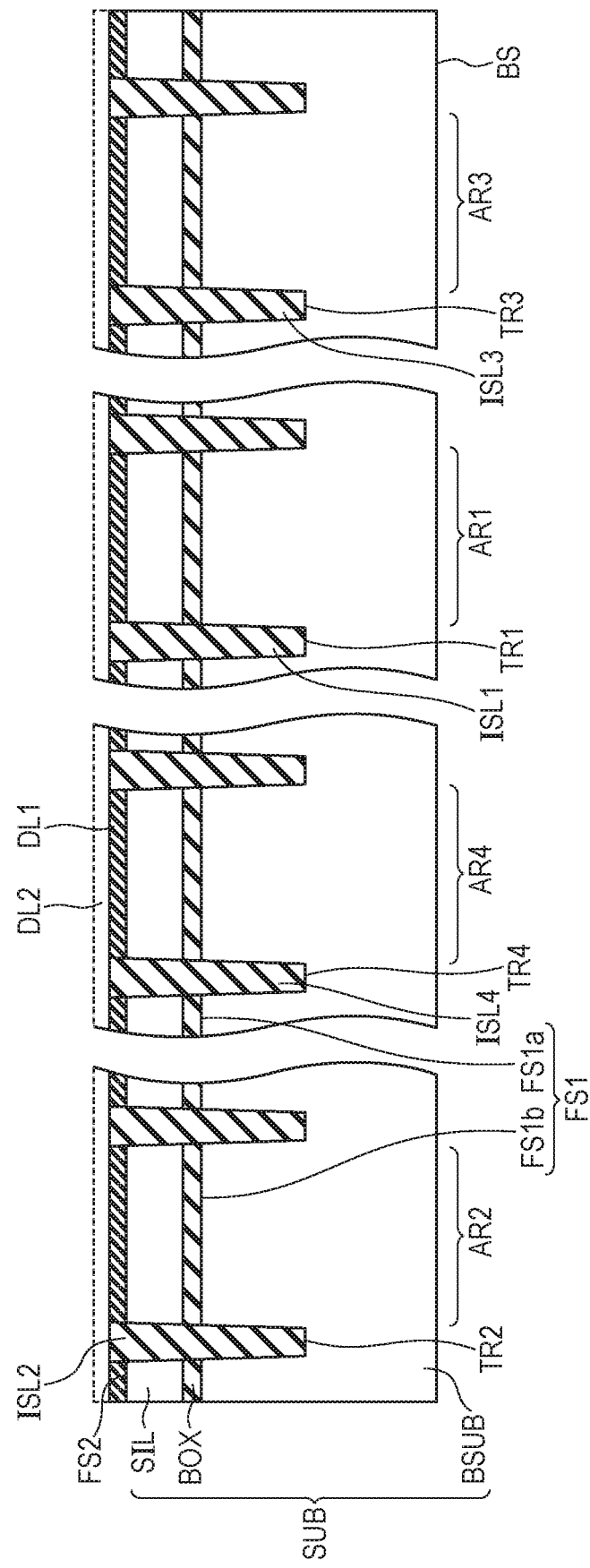
FIG. 9 is a cross-sectional view of the semiconductor device according to First Embodiment in the element isolation film formation step S2.

As shown in FIG. 9, in the element isolation film formation step S2, a first insulating film DL1, a second insulating film DL2, a trench TR1, a trench TR2, a trench TR3, a trench TR4, a first element isolation film ISL1, a second element isolation film ISL2, a third element isolation film ISL3, and a fourth element isolation film ISL4 are formed.

In the element isolation film formation step S2, firstly, the first insulating film DL1 and the second insulating film DL2 are formed. The first insulating film DL1 is formed on the semiconductor layer SIL. The second insulating film DL2 is formed on the first insulating film DL1. The first insulating film DL1 is made of, for example, silicon dioxide. The second insulating film DL2 is made of, for example, silicon nitride. The first insulating film DL1 and the second insulating film DL2 each have an opening at positions where a first element isolation film ISL1, a second element isolation film ISL2, a third element isolation film ISL3 and a fourth element isolation film ISL4 are to be formed.

The first insulating film DL1 and the second insulating film DL2 are formed, for example, by depositing materials configuring the first insulating film DL1 and the second insulating film DL2 by CVD (chemical vapor deposition), respectively, and then patterning the respective materials configuring the thus-formed first insulating film DL1 and second insulating film DL2 by photolithography and etching.

In the element isolation film formation step S2, secondly, the trench TR1, the trench TR2, the trench TR3, and the trench TR4 are formed. The trench TR1, the trench TR2, the trench TR3, and the trench TR4 are formed by anisotropic etching such as RIE (reactive ion etching) with the first insulating film DL1 and the second insulating film DL2 as a mask.

In the element isolation film formation step S2, thirdly, a first element isolation film ISL1, a second element isolation film ISL2, a third element isolation film ISL3, and a fourth element isolation film ISL4 are formed. In the formation of the first to fourth element isolation films ISL1 to ISL4, firstly, trenches TR1 to TR4 are filled with the materials configuring the first element isolation film ISL1 to the fourth element isolation film ISL4 by CVD or the like, respectively. Then, the materials configuring the first to fourth element isolation films ISL1 to ISL4 and protruding from the trench TR1 to the trench TR4 are removed by CMP (chemical mechanical polishing) or the like. After removal of the protruded materials configuring the first element isolation film ISL1 to the fourth element isolation film ISL4, the second insulating film DL2 is removed.

Figure 10:
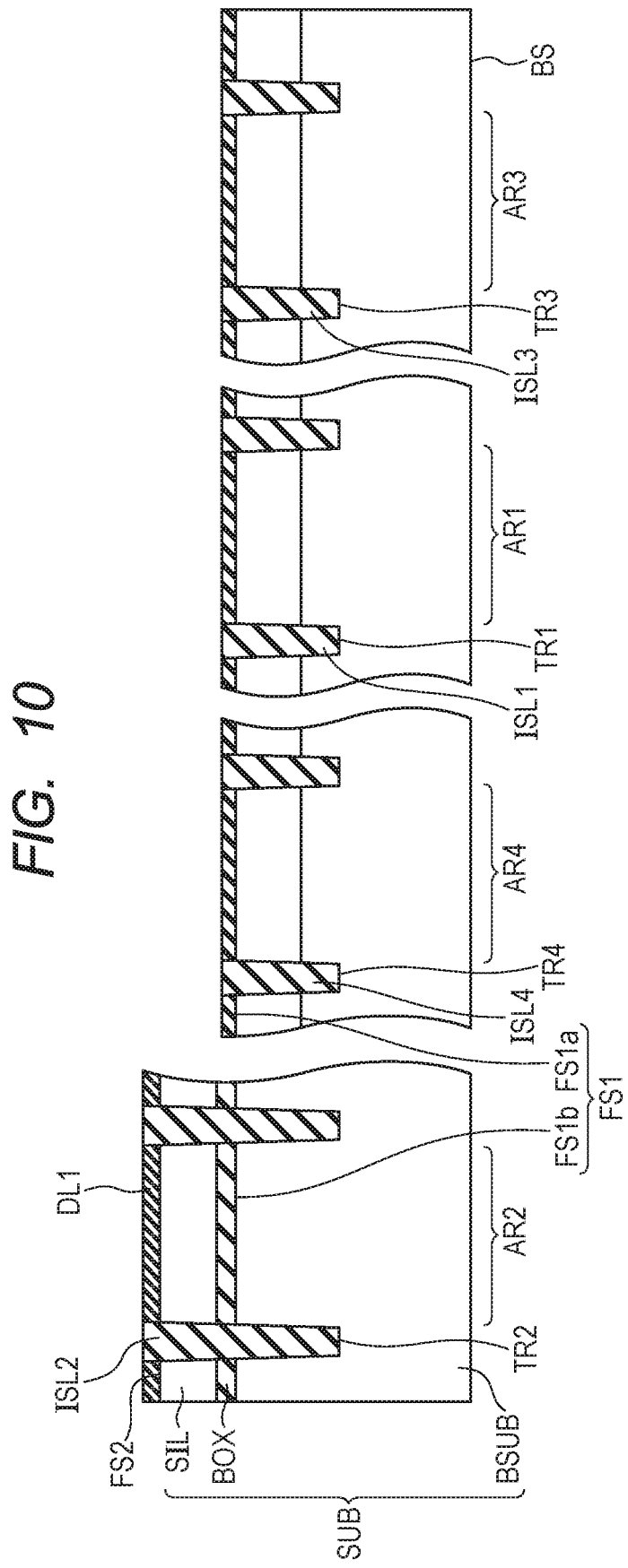
FIG. 10 is a cross-sectional view of the semiconductor device according to First Embodiment in the semiconductor layer removal step S3.

As shown in FIG. 10, in the semiconductor layer removal step S3, the semiconductor layer SIL and the first insulating film DL1 on the first region FS1a are partially removed. In the semiconductor layer removal step S3, the thickness of the insulating film BOX in the first region FS1a remains, though the thickness of it decreases. Removal of the first insulating film DL1 and the semiconductor layer SIL on the first region FS1a is performed, for example, by anisotropic etching such as RIE.

As described above, the SOI substrate SUB having the semiconductor substrate BSUB, the insulating film BOX, and the semiconductor layer SIL and provided with the first element isolation film ISL1 to the fourth element isolation film ISL4 is provided.

Figure 11:
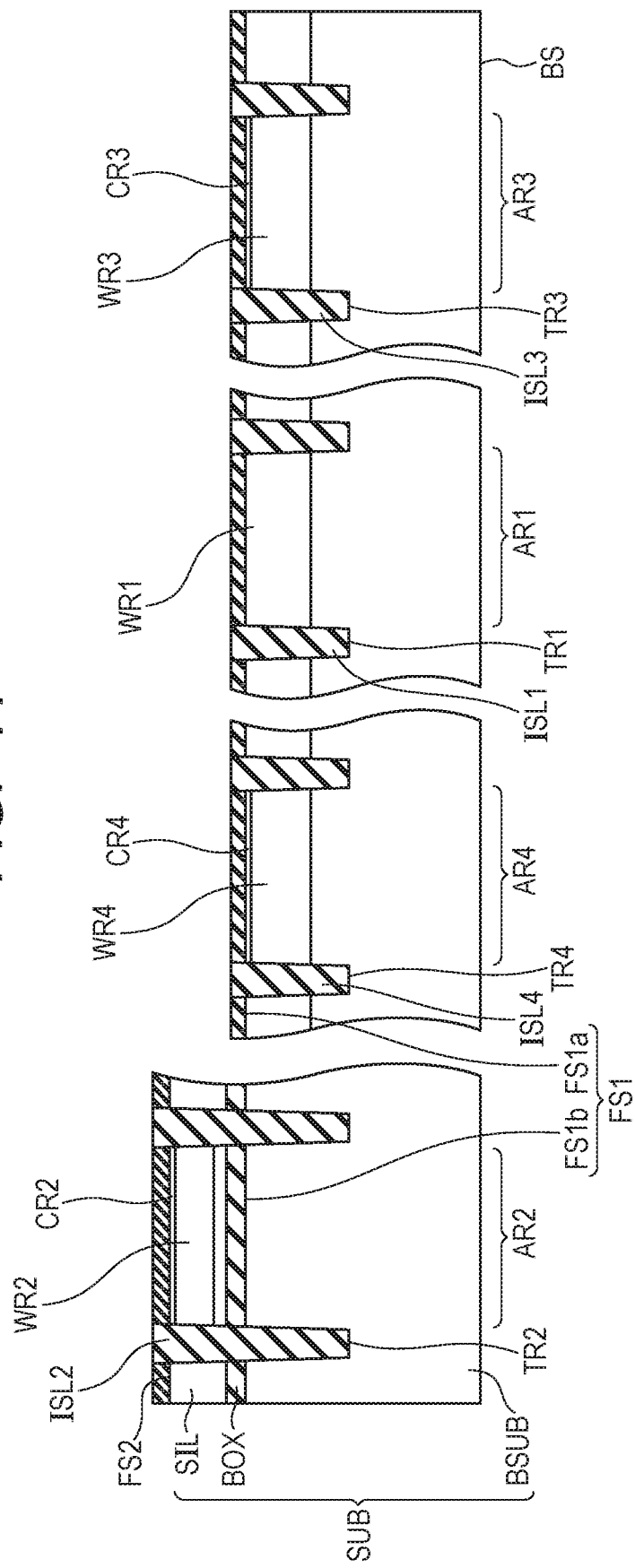
FIG. 11 is a cross-sectional view of the semiconductor device according to First Embodiment in the first ion implantation step S4.

As shown in FIG. 11, in the first ion implantation step S4, a well region WR1, a well region WR2, a well region WR3, and a well region WR4 are formed. Also in the first ion implantation step S4, a channel region CR2, a channel region CR3, and a channel region CR4 are formed. This means that in the first ion implantation step S4, a channel region CR1 is not formed. Formation of the well regions WR1 to WR4 and the channel regions CR2 to CR4 are performed by ion implantation. Ion implantation for the formation of a well region may hereinafter be called "well implantation" and ion implantation for the formation of a channel region may hereinafter be called "channel implantation".

Figure 12:
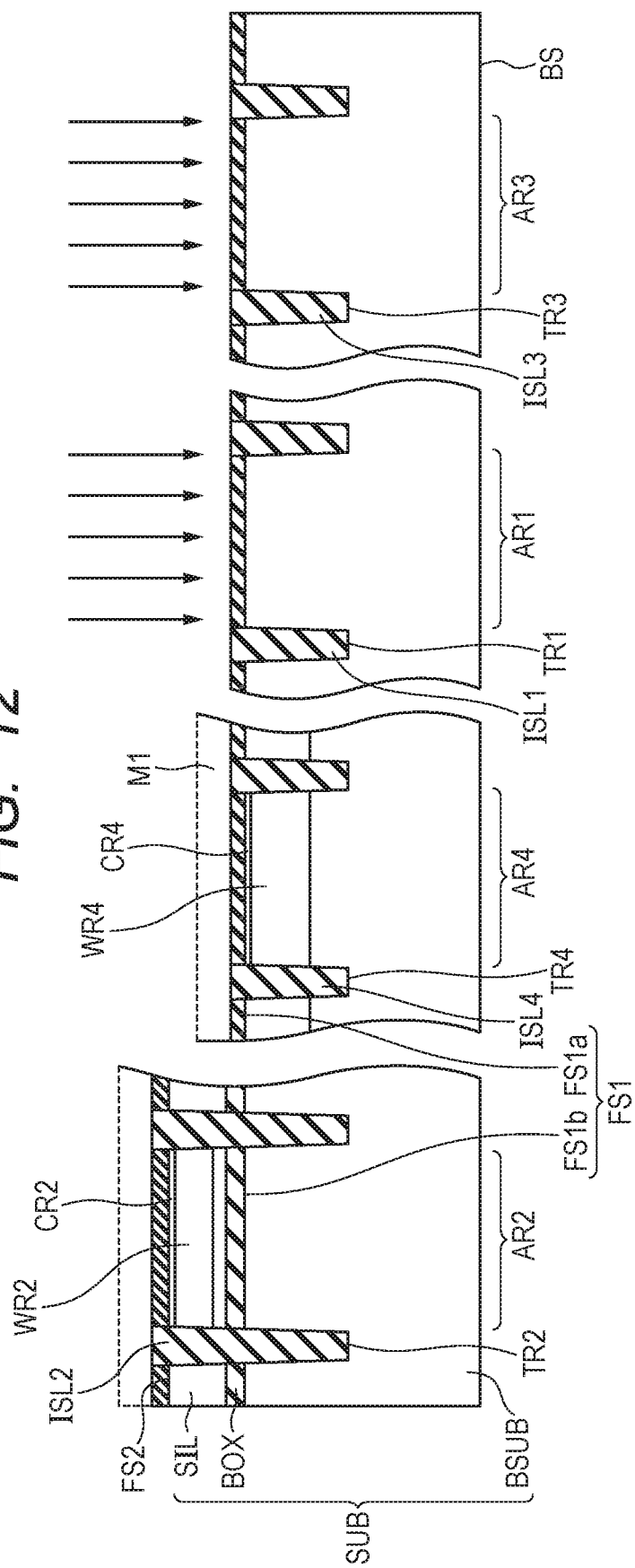
FIG. 12 is a cross-sectional view of the semiconductor device according to First Embodiment when ion implantation for the formation of a well region WR1 and a well region WR3 is performed in the first ion implantation step S4.
Figure 13:
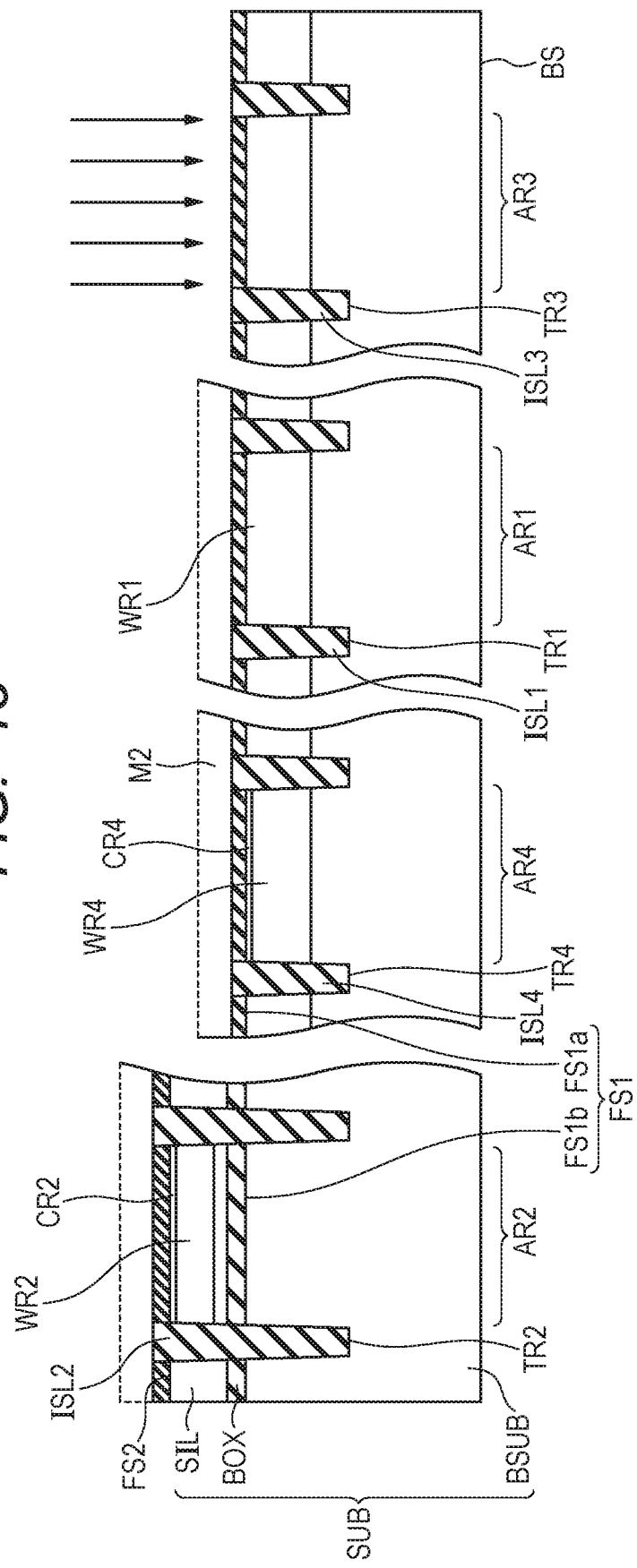
FIG. 13 is a cross-sectional view of the semiconductor device according to First Embodiment when ion implantation for the formation of a channel region CR3 is performed in the first ion implantation step S4.

The well region WR1 and the well region WR3 are formed by first well implantation. The first well implantation is performed, as shown in FIG. 12, using a first mask M1 formed on the first region FS1a and the surface FS2 and having an opening on the memory transistor region AR1 and the second transistor region AR3. On the other hand, the channel region CR3 is formed by first channel implantation. The first channel implantation is, as shown in FIG. 13, performed using a second mask M2 formed on the first region FS1a and the surface FS2 and having an opening on the second transistor region AR3. The first mask M1 and the second mask M2 are, for example, photoresist ones.

Ion implantation for the formation of the well regions WR1 to WR4 and the channel regions CR2 to CR4 is followed by activation annealing.

In the ion implantation for the formation of the well region WR2 and the channel region CR2, the first insulating film DL1 formed on the semiconductor layer SIL functions as an implantation through film. In the ion implantation for the formation of the well region WR1, the well region WR3, the well region WR4, the channel region CR3, and the channel region CR4, the insulating film BOX remaining on the first region FS1a functions as an implantation through film.

Figure 14:
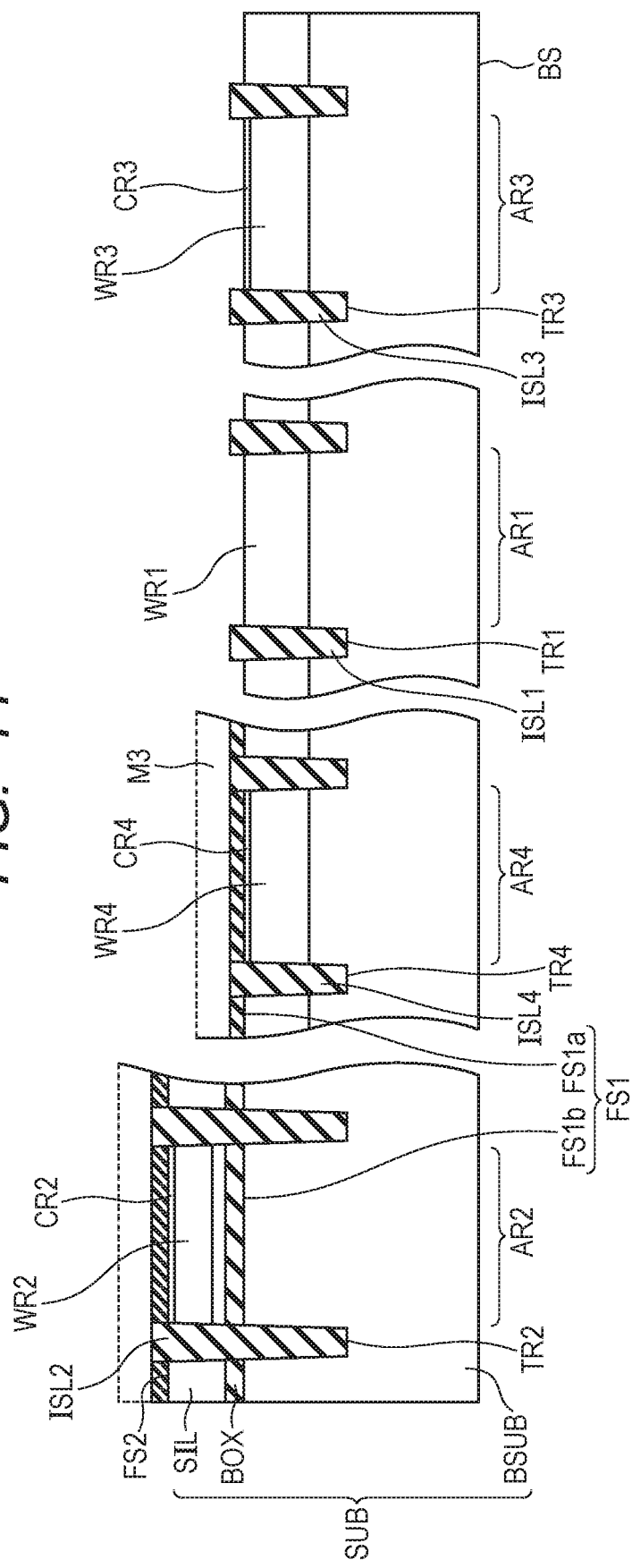
FIG. 14 is a cross-sectional view of the semiconductor device according to First Embodiment in the first etching step S5.

As shown in FIG. 14, in the first etching step S5, the insulating film BOX on the memory transistor region AR1 and the second transistor region AR3 is removed.

The insulating film BOX is removed by wet etching (first wet etching) using a third mask M3 formed on the first region FS1a and the surface FS2 and having an opening on the memory transistor region AR1 and the second transistor region AR3. The third mask M3 is, for example, a photoresist. For wet etching performed in the first etching step S5, a chemical solution, such as hydrofluoric acid (HF), capable of etching silicon dioxide is used.

When the insulating film BOX is removed in the first etching step S5, the first element isolation film ISL1 is partially removed so that the upper surface ISL1a situated at the end portion on the side of the side surface ISL1c is recessed toward the side of the bottom surface ISL1b and at the same time, the third element isolation film ISL3 is partially removed so that the upper surface ISL2a situated at the end portion on the side of the side surface ISL2c is recessed toward the side of the bottom surface ISL2b. This results in an increase in the first recess depth and the third recess depth in the first etching step S5.

Figure 15:
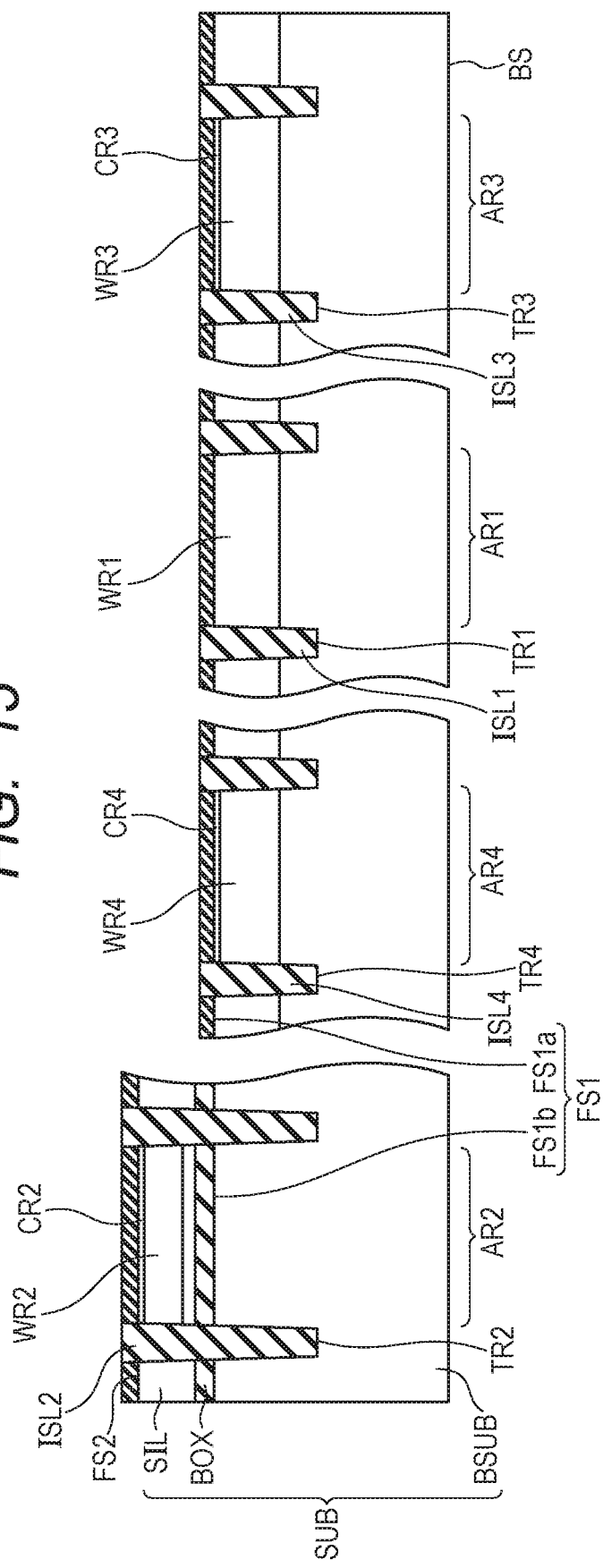
FIG. 15 is a cross-sectional view of the semiconductor device according to First Embodiment in the first gate insulating film formation step S6.

As shown in FIG. 15, in the first gate insulating film formation step S6, a fourth gate insulating film GO4 is formed. The fourth gate insulating film GO4 is formed by thermally oxidizing the first region FS1a and the surface FS2. In the first gate insulating film formation step S6, the fourth gate insulating film GO4 is formed not only on the third transistor region AR4 but also on the memory transistor region AR1, the first transistor region AR2, and the second transistor region AR3. The fourth gate insulating film GO4 formed on the second transistor region AR3 will finally become a third gate insulating film GO3.

Figure 16:
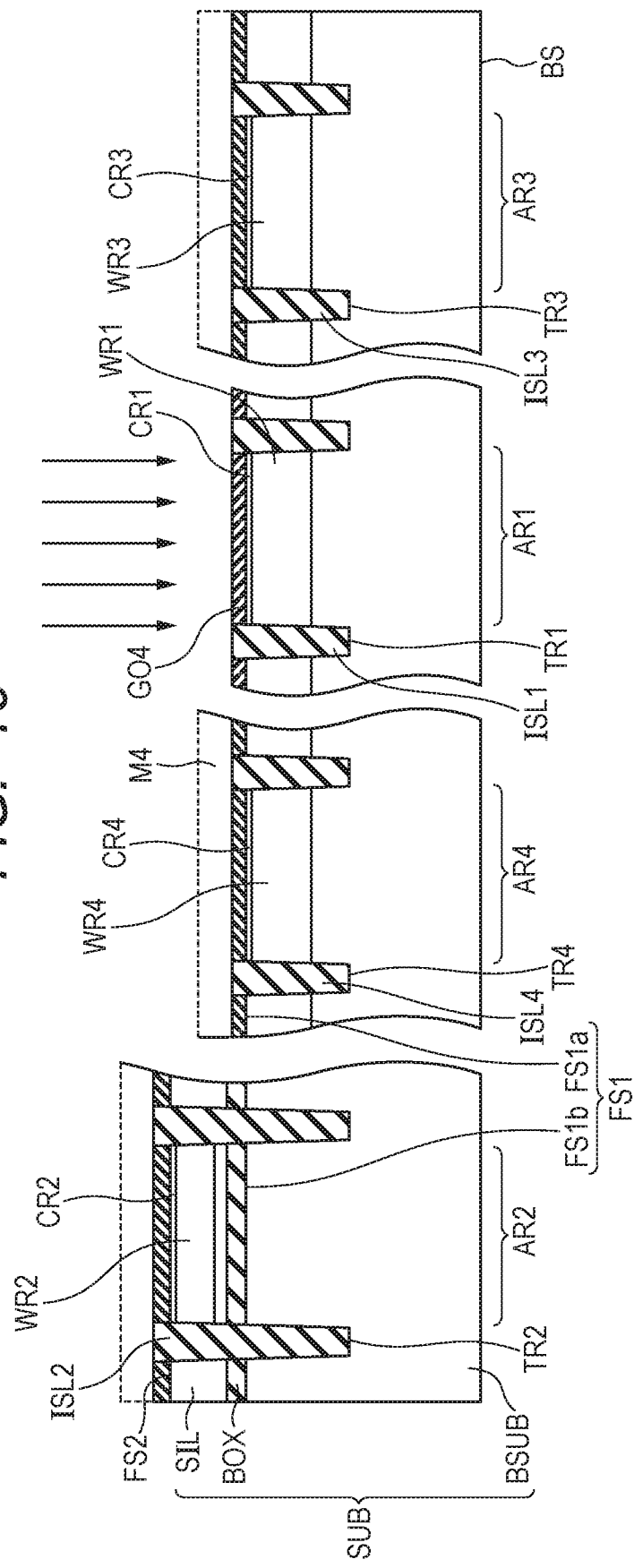
FIG. 16 is a cross-sectional view of the semiconductor device according to First Embodiment in the second ion implantation step S7.

As shown in FIG. 16, in the second ion implantation step S7, a channel region CR1 is formed. The channel region CR1 is formed by ion implantation (third channel implantation) with a fourth mask M4 formed on the first region FS1a and on the surface FS2 and having an opening on the memory transistor region AR1. The fourth mask M4 is, for example, a photoresist. In the ion implantation for the formation of the channel region CR1, the fourth gate insulating film GO4 formed on the memory transistor region AR1 functions as an implantation through film. Ion implantation for the formation of the channel region CR1 is followed by activation annealing.

Figure 17:
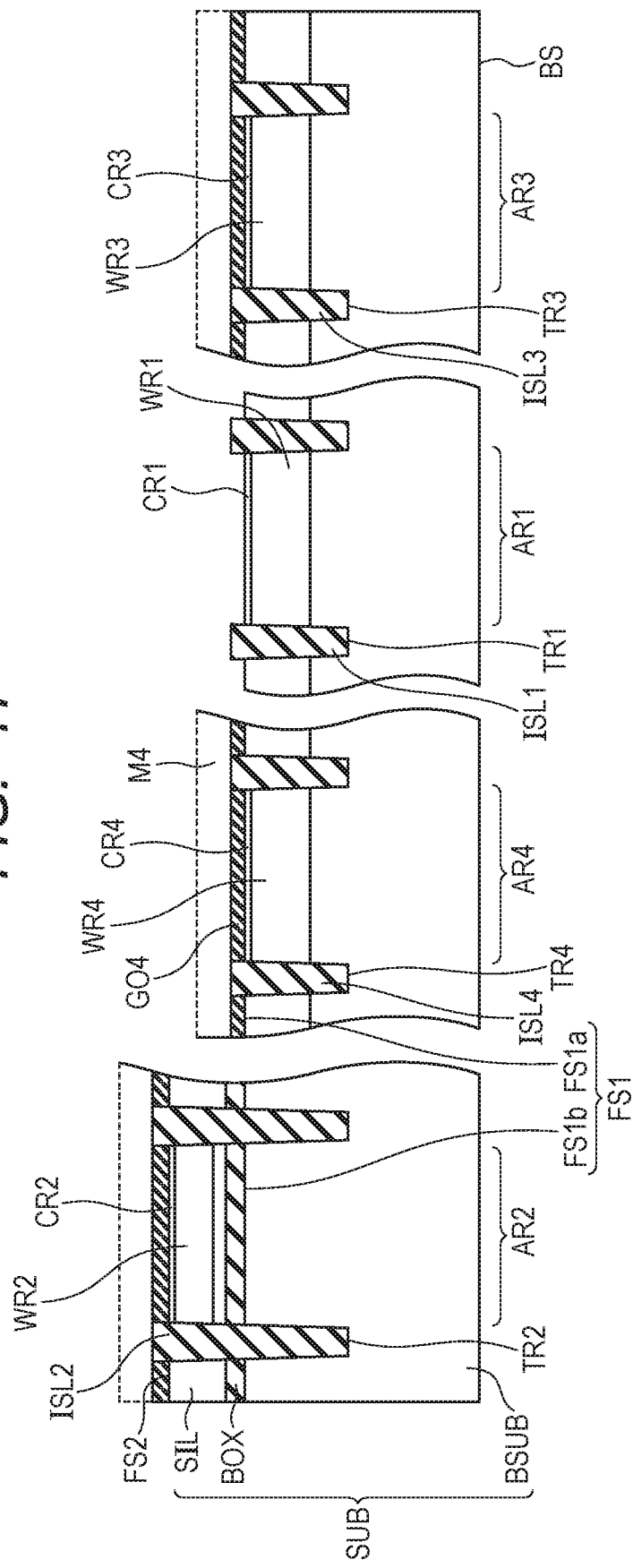
FIG. 17 is a cross-sectional view of the semiconductor device according to First Embodiment in the second etching step S8.

As shown in FIG. 17, in the second etching step S8, the fourth gate insulating film GO4 formed on the memory transistor region AR1 is removed. The fourth gate insulating film GO4 is removed by wet etching (second wet etching) with the fourth mask M4. A chemical solution used for the wet etching in the second etching step S8 is, for example, hydrofluoric acid.

When the fourth gate insulating film GO4 on the memory transistor region AR1 is removed in the second etching step S8, the first element isolation film ISL1 is partially removed so that the upper surface ISL1a situated at the end portion on the side of the side surface ISL1c is recessed further toward the side of the bottom surface ISL1b. As a result, the first recess depth upon completion of the second etching step S8 shows a further increase compared with that upon completion of the first etching step S5.

Figure 18:
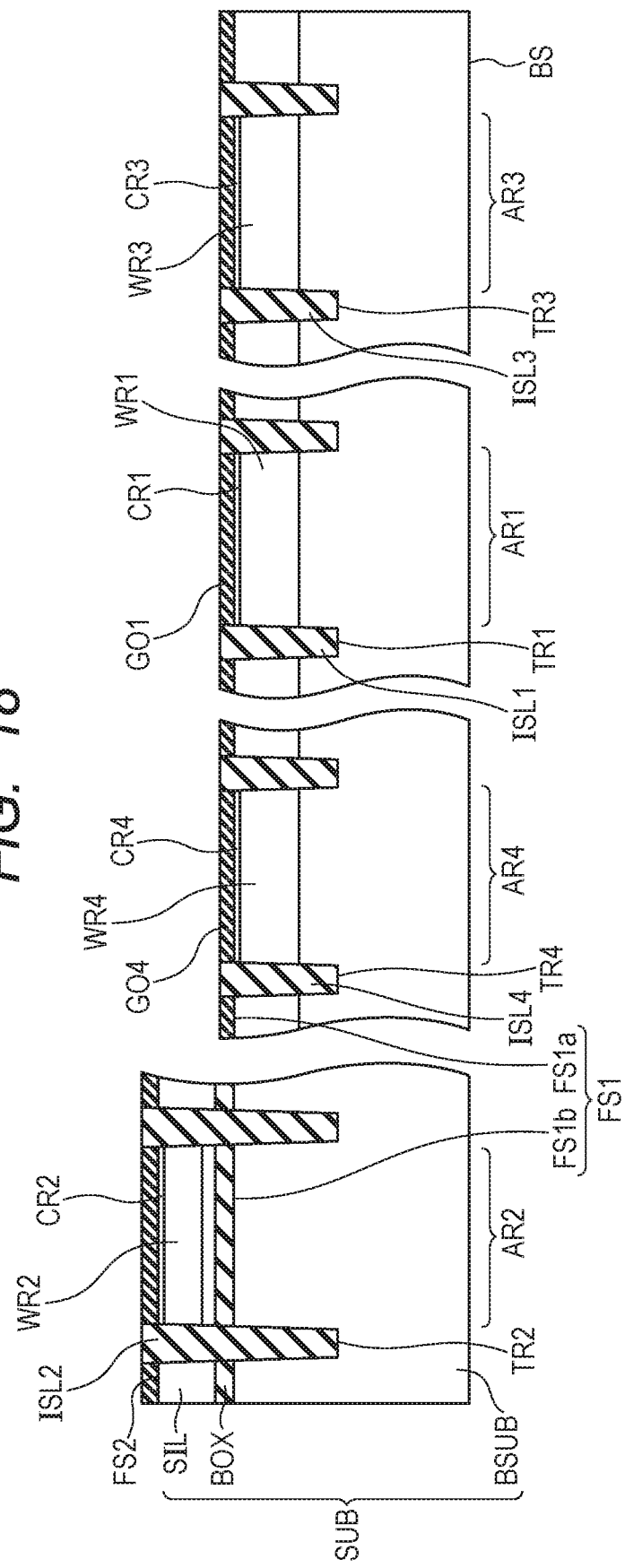
FIG. 18 is a cross-sectional view of the semiconductor device according to First Embodiment in the second gate insulating film formation step S9.

As shown in FIG. 18, in the second gate insulating film formation step S9, a first gate insulating film GO1 is formed. In the second gate insulating film formation step S9, firstly, materials configuring the first gate insulating film GO1 are deposited. More specifically, materials configuring the first oxide film, nitride film, and second oxide film are deposited successively by CVD or the like. In the second gate insulating film formation step S9, then, the materials of the thus-formed first gate insulating film GO1 is patterned by photolithography and etching.

Figure 19:
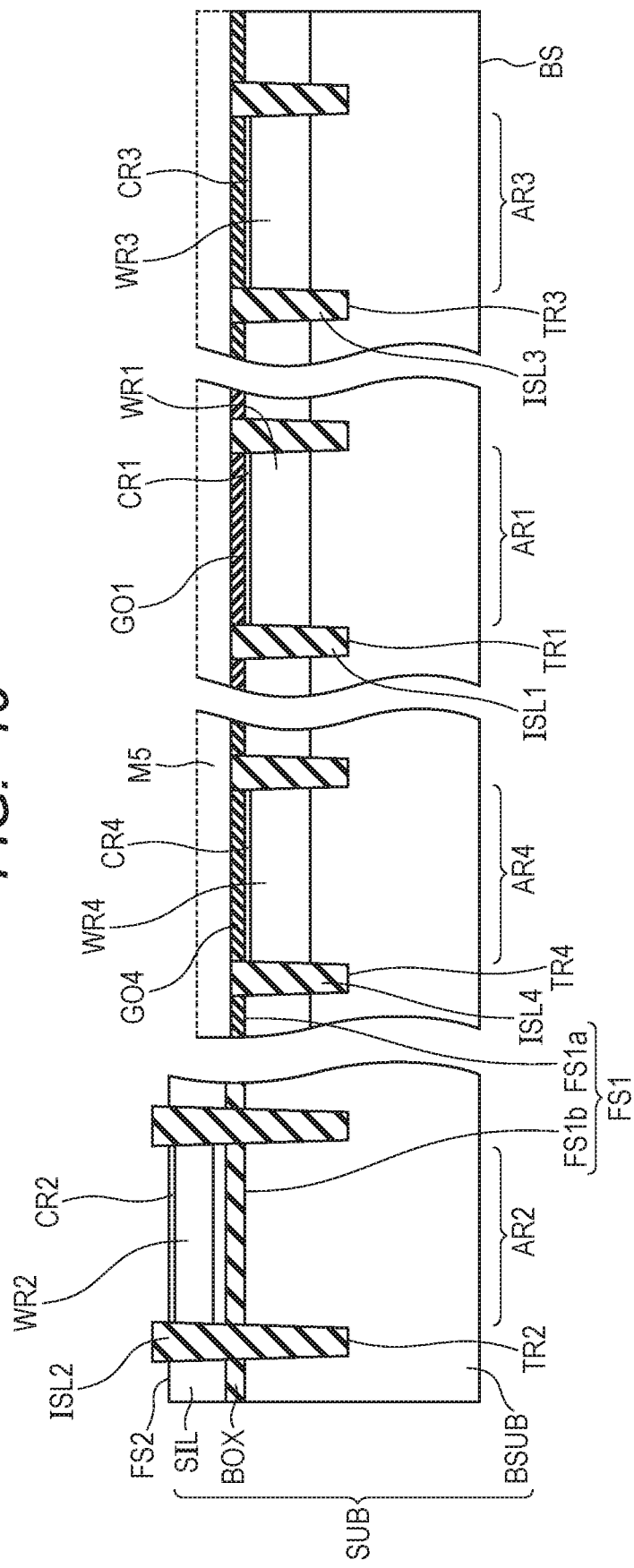
FIG. 19 is a cross-sectional view of the semiconductor device according to First Embodiment in the third etching step S10.

As shown in FIG. 19, in the third etching step S10, the fourth gate insulating film GO4 on the first transistor region AR2 is removed. The fourth gate insulating film GO4 on the first transistor region AR2 is performed by wet etching (third wet etching) with a fifth mask M5 formed on the first region FS1a and the surface FS2 and having an opening on the first transistor region AR2. The fifth mask M5 is, for example, a photoresist. A chemical solution to be used in wet etching in the third etching step S10 is, for example, hydrofluoric acid. Wet etching time in the third etching step S10 is shorter than that in the first etching step S5. At the time of removing the fourth gate insulating film GO4 on the first transistor region AR2 by the third wet etching, the fourth element isolation film ISL4 is partially removed so that the upper surface ISL4a at the end portion on the side of the side surface ISL4c is recessed toward the side of the bottom surface ISL4b.

In the third etching step S10, washing is performed after the removal of the fourth gate insulating film GO4 on the first transistor region AR2 by the third wet etching. This washing is performed, for example, with SPM (sulfuric acid/hydrogen peroxide mixture). The semiconductor layer SIL is partially removed by this washing so that the surface FS2 in the first transistor region AR2 becomes closer to the side of the semiconductor substrate BSUB. In the third etching step S10, therefore, the second recess depth once increases just after the third wet etching, but it does not show an increase after washing.

Upon completion of the third etching step S10, therefore, there is the following relationship: fourth recess depth<third recess depth<third recess depth<first recess depth. This relationship is maintained on and after the third etching step S10 because there is not a step of changing the recess depth of each element isolation film on and after the third etching step S10.

Figure 20:
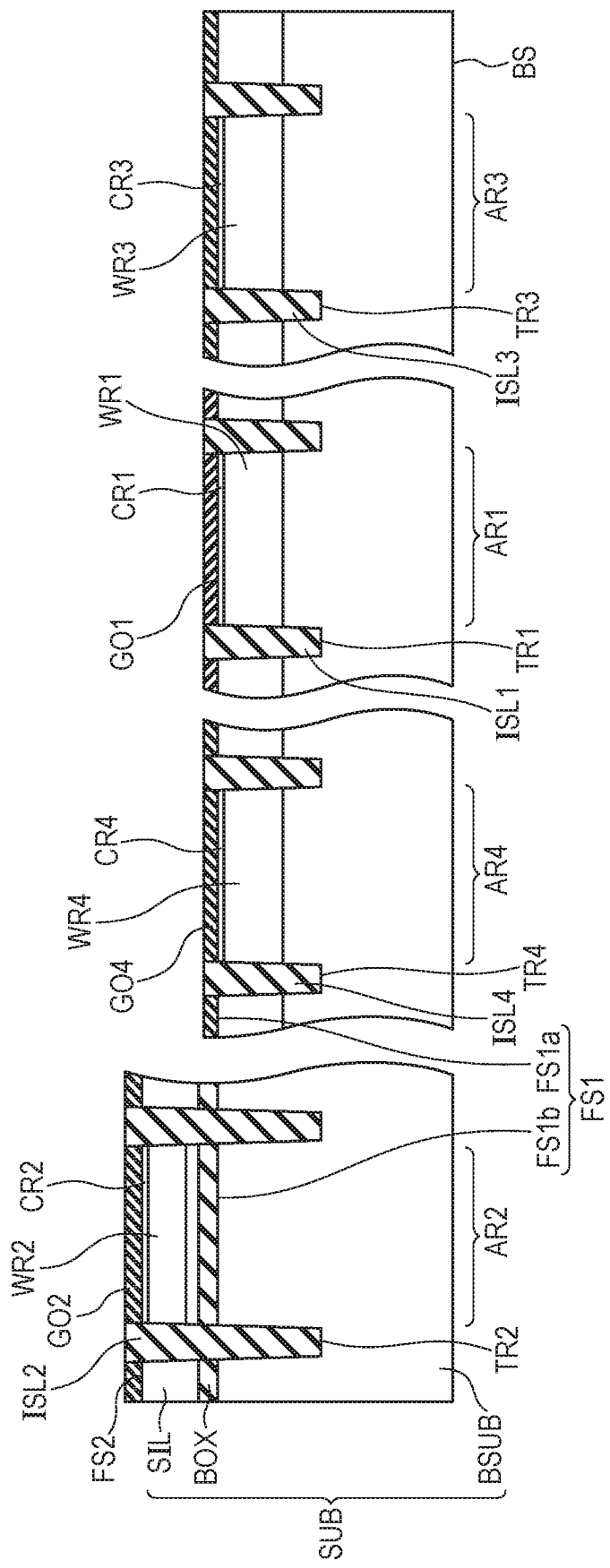
FIG. 20 is a cross-sectional view of the semiconductor device according to First Embodiment in the third gate insulating film formation step S11.

As shown in FIG. 20, in the third gate insulating film formation step S11, a second gate insulating film GO2 is formed. The second gate insulating film GO2 is formed by thermally oxidizing the surface FS2 in the first transistor region AR2.

Figure 21:
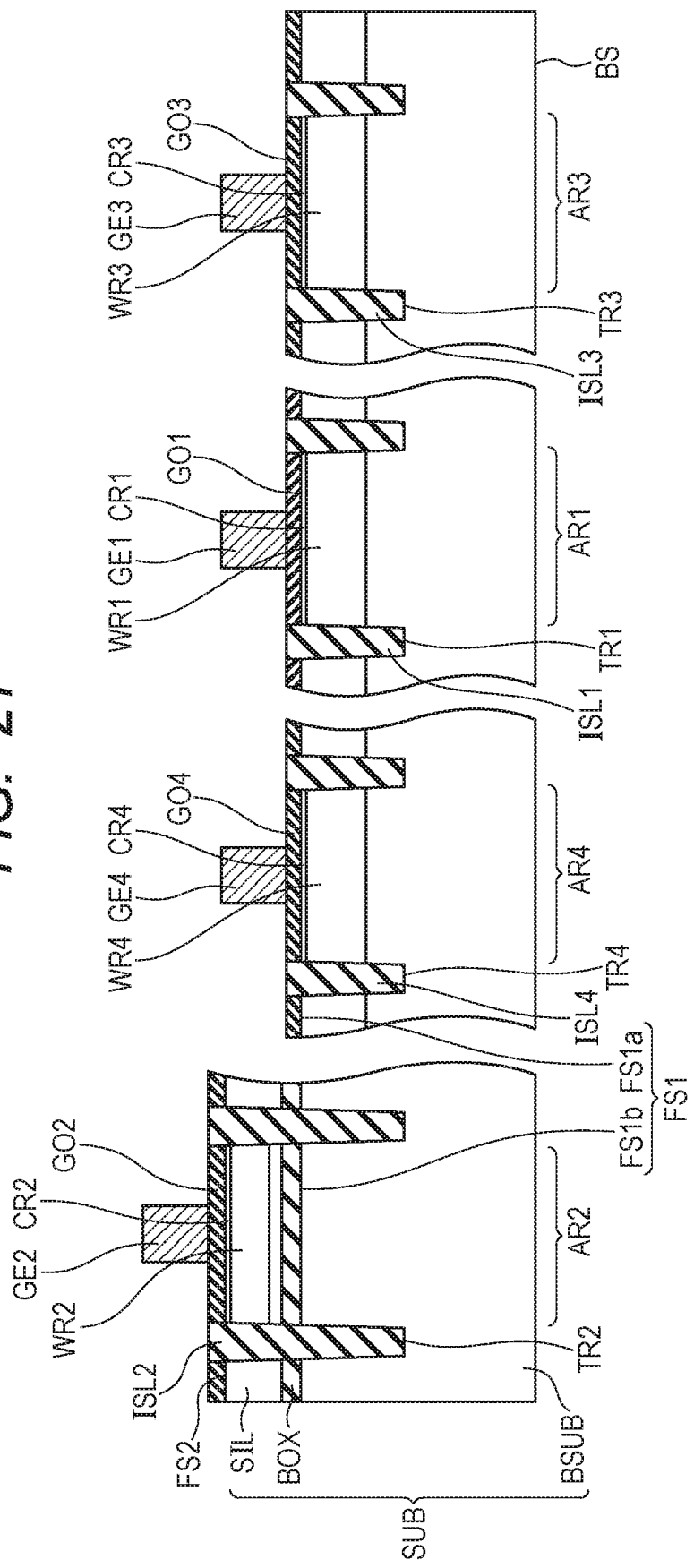
FIG. 21 is a cross-sectional view of the semiconductor device according to First Embodiment in the gate electrode formation step S12.

As shown in FIG. 21, in the gate electrode formation step S12, a gate electrode GE1, a gate electrode GE2, a gate electrode GE3, and a gate electrode GE4 are formed. In the gate electrode formation step S12, materials configuring the gate electrodes GE1 to GE4 are deposited, for example, by CVD. Next, in the gate electrode formation step S12, the materials of the thus-formed gate electrodes GE1 to GE4 are patterned by photolithography and etching.

Figure 22:
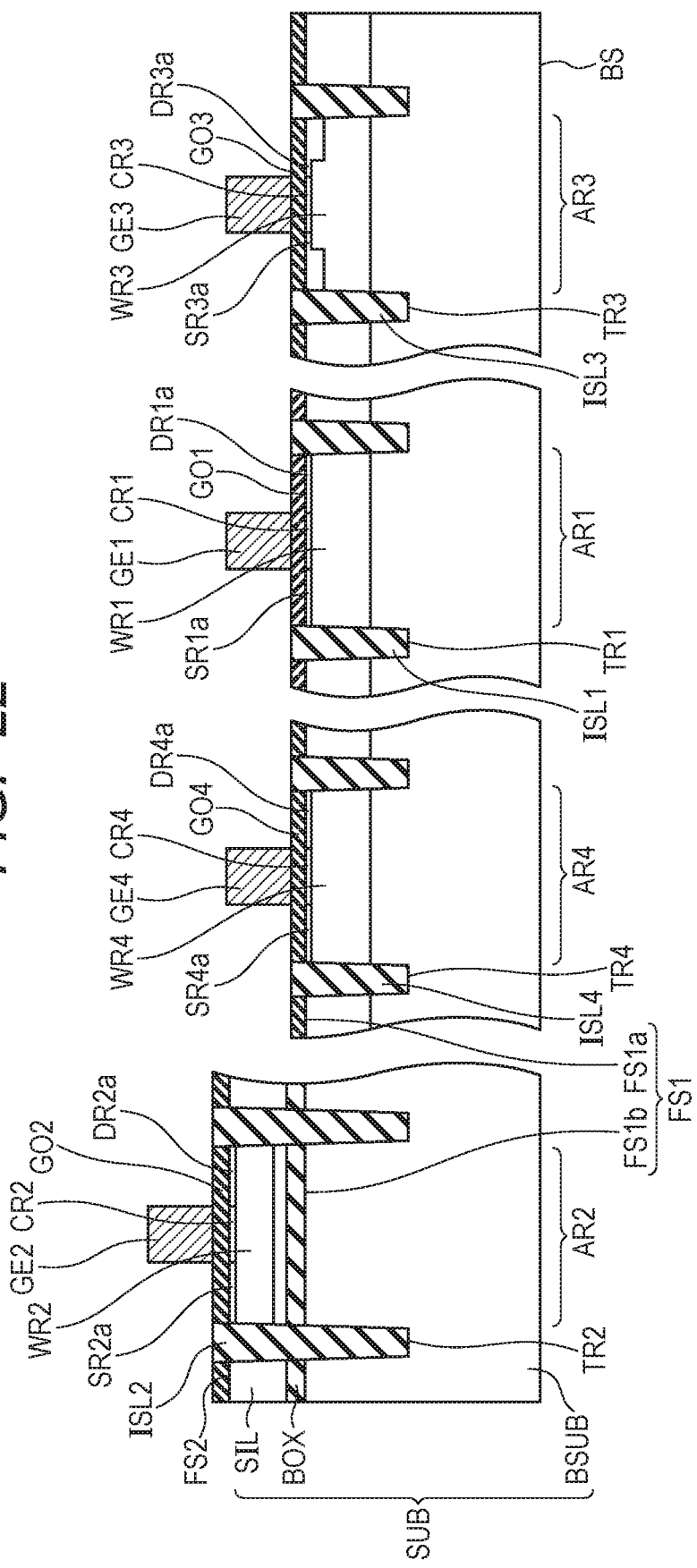
FIG. 22 is a cross-sectional view of the semiconductor device according to First Embodiment in the third ion implantation step S13.

As shown in FIG. 22, in the third ion implantation step S13, first portions SR1a to SR4a and first portions DR1a to DR4a are formed. The first portions SR1a to SR4a and the first portions DR1a to DR4a are formed by ion implantation with the first to fourth element isolation films ISL1 to ISL4 and the gate electrodes GE1 to GE4 as a mask.

Figure 23:
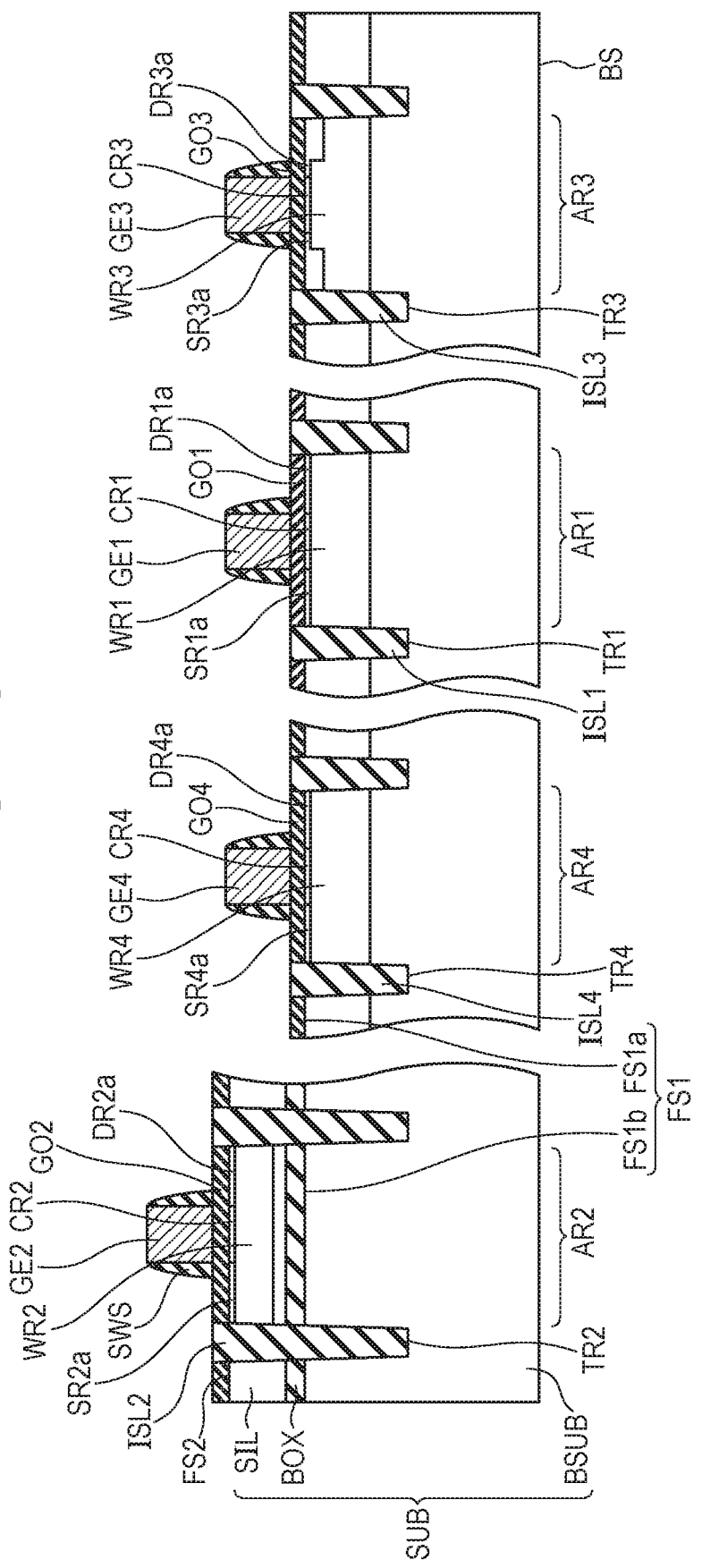
FIG. 23 is a cross-sectional view of the semiconductor device according to First Embodiment in the sidewall spacer formation step S14.

As shown in FIG. 23, in the sidewall spacer formation step S14, a sidewall spacer SWS is formed. In the sidewall spacer formation step S14, firstly, a material configuring the sidewall spacer SWS is deposited by CVD or the like on the first region FS1a and the surface FS2. In the sidewall spacer formation step S14, next, the material of the thus-formed sidewall spacer SWS is etched back until exposure of the upper surface of the gate electrodes GE1 to GE4.

In the fourth ion implantation step S15, second portions SR1b to SR4b and second portions DR1b to DR4b are formed. The second portions SR1b to SR4b and the second portions DR1b to DR4b are formed by ion implantation with the first to fourth element isolation films ISL1 to ISL4, the gate electrodes GE1 to GE4, and the sidewall spacer SWS as a mask. Thus, formation of the structure of the semiconductor device according to First Embodiment as shown in FIG. 2 is completed.

Advantage of Semiconductor Device According to First Embodiment

The advantage of the semiconductor device according to First Embodiment will hereinafter be described while comparing it with Comparative Example.

Figure 24:
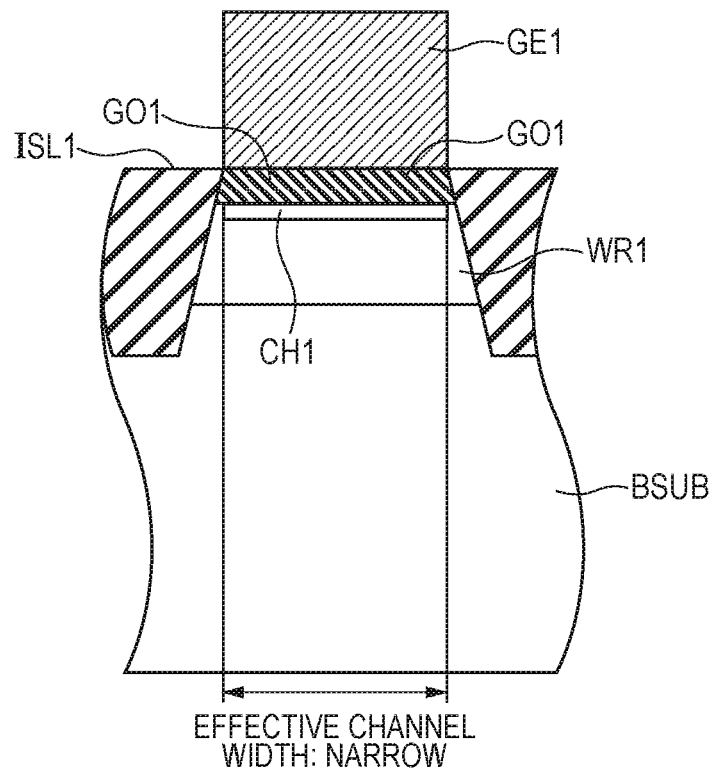
FIG. 24 is a cross-sectional view of a first transistor Tr1 of the semiconductor device of Comparative Example in the cross-section perpendicular to the channel length direction of the semiconductor device.

As shown in FIG. 24, a semiconductor device of Comparative Example has no recess ISL1d therein. In the semiconductor device of Comparative Example, therefore, the end portion of the first element isolation film ISL1 situated on the side of the memory transistor region AR1 protrudes so as to hang over the memory transistor region AR1.

In the semiconductor device of Comparative Example, this results in narrowing of the effective channel width of the first transistor Tr1, because ion implantation to the memory transistor region AR1 is blocked by the end portion of the first element isolation film ISL1 that protrudes to hang over the memory transistor region AR1. With a decrease in the channel width, the ON resistance of the first transistor Tr1 increases (ON current decreases) and at the same time, the first transistor Tr1 has deteriorated reliability (retention property).

Figure 25:
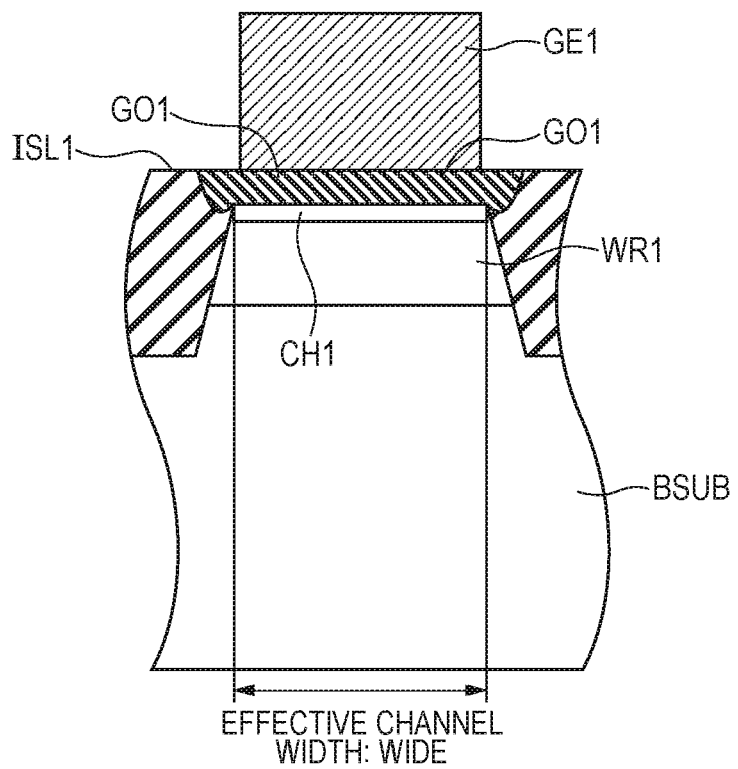
FIG. 25 is a cross-sectional view of the first transistor Tr1 of the semiconductor device according to First Embodiment in the cross-section perpendicular to the channel length direction of the semiconductor device.

In the semiconductor device according to First Embodiment, on the other hand, the first element isolation film ISL1 has the recess ISL1d. As shown in FIG. 25, in the semiconductor device according to First Embodiment, therefore, the end portion of the first element isolation film ISL1 situated on the side of the memory transistor region AR1 does not protrude to hang over the memory transistor region AR1, making it possible to enlarge the effective channel width of the first transistor Tr1.

Due to a difference in thermal expansion coefficient between the first element isolation film ISL1 and the semiconductor substrate BSUB, when the first element isolation film ISL1 is formed, a residual stress occurs in the channel region CR1. This residual stress causes variations in electron level in the first gate insulating film GO1 so that it may be a cause for deteriorating the reliability (retention property) of the first transistor Tr1.

In the semiconductor device according to First Embodiment, the first element isolation film ISL1 situated on the side of the memory transistor region AR1 has the recess ISL1d at the end portion of the film so that a residual stress attributable to the formation of the first element isolation film ISL1 is released partially. The semiconductor device according to First Embodiment can therefore have the first transistor Tr1 with improved reliability (retention property).

Variations in the shape of the element isolation film have an influence on the channel-width dependence of the property of the transistor formed in the active region surrounded by this element isolation film. In the semiconductor device according to First Embodiment, the second recess depth is smaller than the first recess depth so that a change in the channel-width dependence of the property of the second transistor Tr2 can be suppressed.

In the semiconductor device according to First Embodiment, when the third recess depth is larger than the second recess depth, the effective channel width of the third transistor Tr3 can be enlarged to increase the ON current (decrease the ON resistance) of the third transistor Tr3.

When the second recess depth is larger than Thickness T, the insulating film BOX or the semiconductor substrate BSUB is exposed from the recess at the end portion of the second element isolation film ISL2 situated on the side of the first transistor region AR2. In the semiconductor device according to First Embodiment, when the second recess depth is smaller than Thickness T, poor breakdown voltage between the semiconductor layer SIL or the insulating film BOX and the semiconductor substrate BSUB can be suppressed.

On the other hand, the memory transistor region AR1 and the second transistor region AR3 are placed in the semiconductor substrate BSUB so that the problem such as poor breakdown voltage as described above does not occur even if the first recess depth and the third recess depth are larger than Thickness T.

Advantage of the Method of Manufacturing the Semiconductor Device According to First Embodiment The advantage of the method of manufacturing the semiconductor device according to First Embodiment will next be described.

In the semiconductor device obtained by the method of manufacturing the semiconductor device according to First Embodiment, a change in channel-width dependence of the property of the second transistor Tr2 can be suppressed and the first transistor Tr1 can have improved reliability (retention property).

In the method of manufacturing the semiconductor device according to First Embodiment, the same mask (fourth mask M4) is used for channel implantation into the memory transistor region AR1 and removal of the fourth gate insulating film GO4 on the memory transistor region AR1. The method of manufacturing the semiconductor device according to First Embodiment makes it possible to omit formation of a mask exclusively used for the channel implantation in the first ion implantation step S4 (meaning, to reduce a manufacturing cost).

In the method of manufacturing the semiconductor device according to First Embodiment, channel implantation (ion implantation for forming the channel region CR1) into the memory transistor region AR1 is performed, while having the fourth gate insulating film GO4 on the memory transistor region AR1 so that the fourth gate insulating film GO4 functions as an implantation through film for channel implantation. The channel implantation into the memory transistor region AR1 can therefore be performed stably.

Configuration of Second Embodiment

Configuration of the semiconductor device according to Second Embodiment is similar to that of the semiconductor device according to First Embodiment.

Method of Manufacturing the Semiconductor Device According to Second Embodiment

The method of manufacturing the semiconductor device according to Second Embodiment will hereinafter be described. A difference from the method of manufacturing the semiconductor device according to First Embodiment will next be described mainly and an overlapping description will be omitted.

The method of manufacturing the semiconductor device according to Second Embodiment has the substrate providing step S1, the element isolation film formation step S2, the semiconductor layer removal step S3, the first ion implantation step S4, and the first etching step S5.

The method of manufacturing the semiconductor device according to Second Embodiment further has the first gate insulating film formation step S6, the second ion implantation step S7, the second etching step S8, and the second gate insulating film formation step S9.

The method of manufacturing the semiconductor device according to Second Embodiment still further has the third etching step S10, the third gate insulating film formation step S11, the gate electrode formation step S12, the third ion implantation step S13, the sidewall spacer formation step S14, and the fourth ion implantation step S15.

These steps are common to the method of manufacturing the semiconductor device according to Second Embodiment and the method of manufacturing the semiconductor device according to First Embodiment. The method of manufacturing the semiconductor device according to Second Embodiment is however different from the method of manufacturing the semiconductor device according to First Embodiment in details of the first ion implantation step S4 and the second ion implantation step S7.

As described above, in the method of manufacturing the semiconductor device according to First Embodiment, the third mask M3 is used for the first wet etching.

Figure 26:
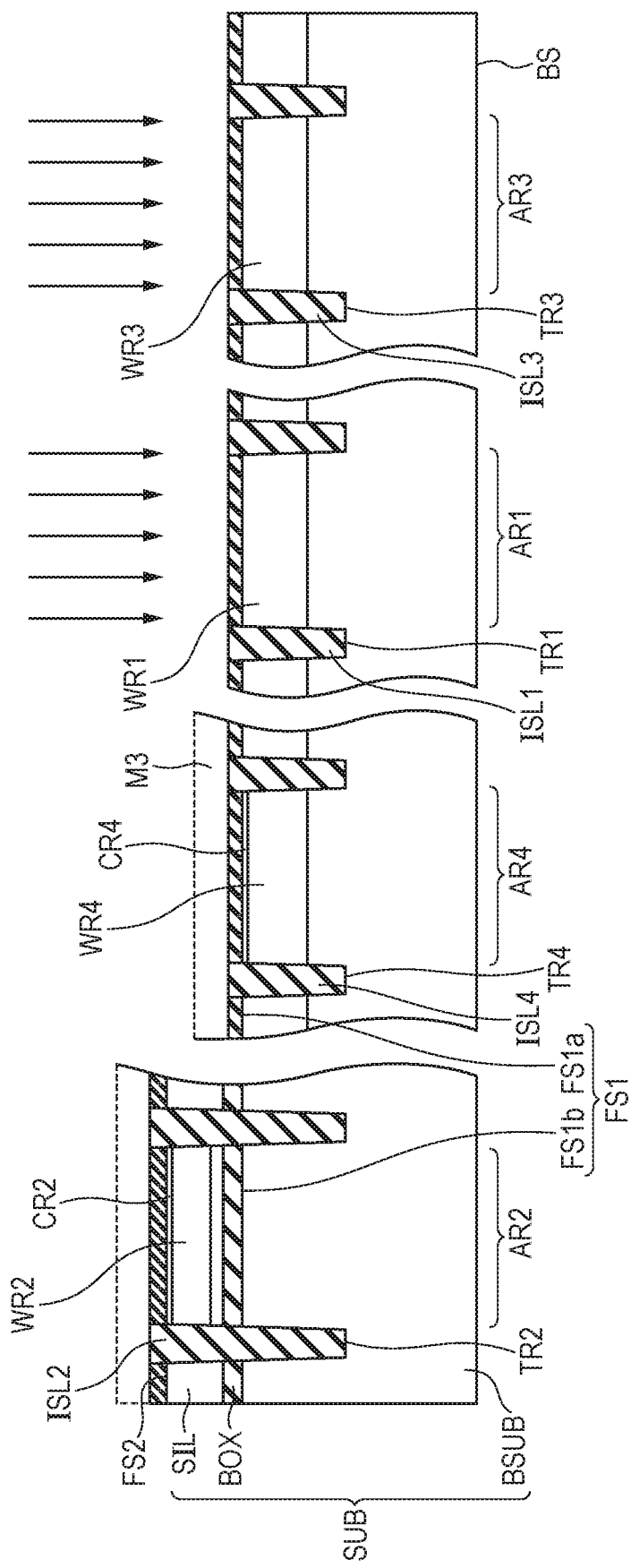
FIG. 26 is a cross-sectional view of a semiconductor device according to Second Embodiment when ion implantation for a channel region CR1 and a channel region CR3 are formed in the first ion implantation step S4.
Figure 27:
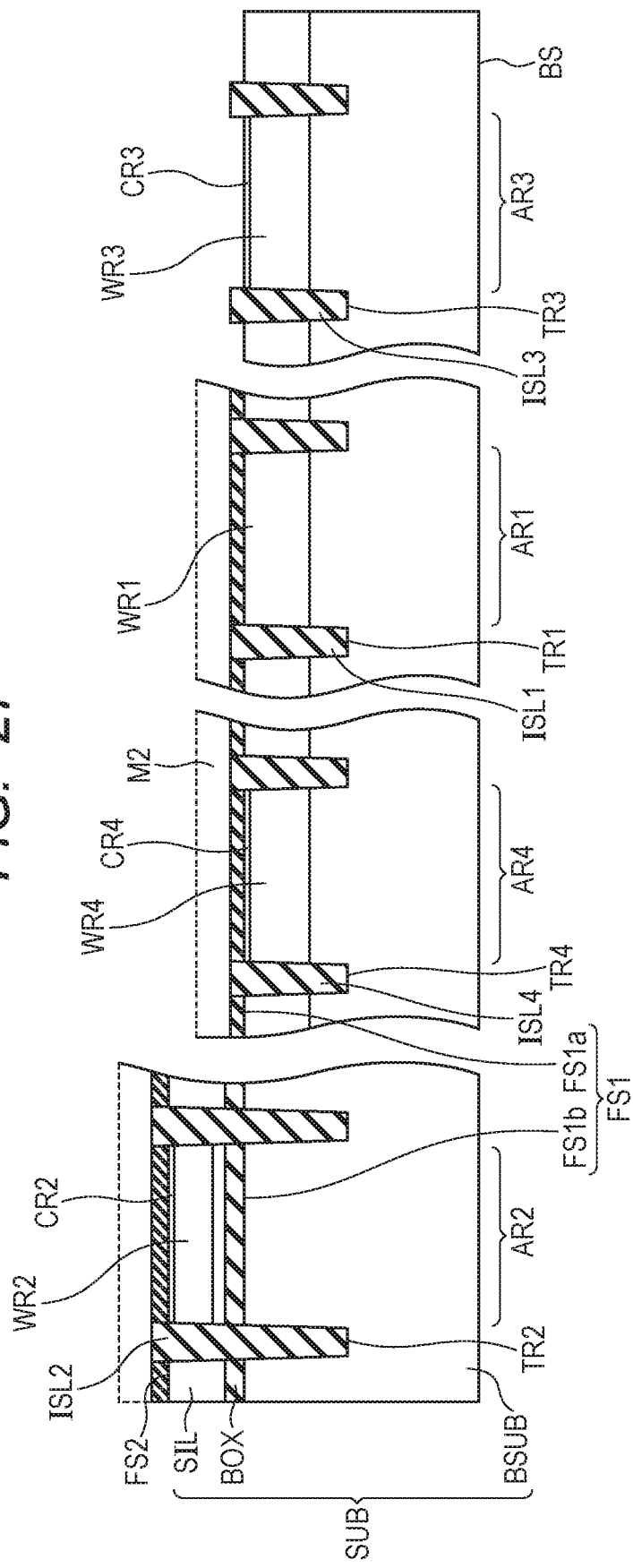
FIG. 27 is a cross-sectional view of a semiconductor device according to Third Embodiment in the first etching step S5.

In the method of manufacturing the semiconductor device according to Second Embodiment, on the other hand, the third mask M3 is used not only for first wet etching but also for ion implantation for forming the channel region CR1 and the channel region CR3 (of which ion implantation for forming the channel region CR1 is called "second channel implantation"), as shown in FIG. 26. The method of manufacturing the semiconductor device according to Second Embodiment does not need formation of the first mask M1 and the second mask M2.

Since the first channel implantation and the second channel implantation are performed using the same mask (third mask M3) in the method of manufacturing the semiconductor device according to Second Embodiment, the channel region CR1 and the channel region CR3 have the same impurity concentration just after completion of the first ion implantation step S4.

The impurity concentration of the channel region CR1 is adjusted in the second ion implantation step S7 (by third channel implantation). More specifically, when the impurity concentration of the channel region CR1 is insufficient, ions of the same kind as those implanted in the first ion implantation step S4 are implanted in addition in the second ion implantation step S7 (for example, when boron (B) ions are implanted in the first ion implantation step S4, boron ions are implanted in addition in the second ion implantation step S7).

When the channel region CR1 has an excessive impurity concentration, on the other hand, ions for reducing the effective ion concentration of the channel region CR1 are additionally implanted in the second ion implantation step S7 (for example, when boron ions are implanted in the first ion implantation step S4, arsenic (As) ions or phosphorus (P) ions are additionally implanted in the second ion implantation step S7.

Advantage of the Method of Manufacturing the Semiconductor Device According to Second Embodiment The advantage of the manufacturing method of the semiconductor device according to Second Embodiment will hereinafter be described.

The method of manufacturing the semiconductor device according to Second Embodiment does not need to use the second mask M2. The method of manufacturing the semiconductor device according to Second Embodiment therefore makes it possible to reduce the number of masks necessary for manufacturing steps and therefore reduce the manufacturing cost.

Configuration of Third Embodiment

The configuration of the semiconductor device according to Third Embodiment is similar to that of the semiconductor device according to First Embodiment.

Method of Manufacturing the Semiconductor Device According to Third Embodiment

The method of manufacturing the semiconductor device according to Third Embodiment will hereinafter be described. A difference from the method of manufacturing the semiconductor device according to First Embodiment will next be described mainly and an overlapping description will be omitted.

The method of manufacturing the semiconductor device according to Third Embodiment has the substrate providing step S1, the element isolation film formation step S2, the semiconductor layer removal step S3, the first ion implantation step S4, and the first etching step S5.

The method of manufacturing the semiconductor device according to Third Embodiment further has the first gate insulating film formation step S6, the second ion implantation step S7, the second etching step S8, and the second gate insulating film formation step S9.

The method of manufacturing the semiconductor device according to Third Embodiment still further has the third etching step S10, the third gate insulating film formation step S11, the gate electrode formation step S12, the third ion implantation step S13, the sidewall spacer formation step S14, and the fourth ion implantation step S15.

These steps are common to the method of manufacturing the semiconductor device according to Third Embodiment and the method of manufacturing the semiconductor device according to First Embodiment. The method of manufacturing the semiconductor device according to third Embodiment is however different from the method of manufacturing the semiconductor device according to First Embodiment in details of the first etching step S5.

As described above, in the method of manufacturing the semiconductor device according to First Embodiment, the first etching step S5 is performed using the third mask M3 having an opening on the memory transistor region AR1 and the second transistor region AR3 (refer to FIG. 14).

In the method of manufacturing the semiconductor device according to Third Embodiment, on the other hand, the first etching step S5 is performed using the second mask M2, which is used for the formation of the channel region CR3 in the first ion implantation step S4, but not using the third mask M3. This means that in the method of manufacturing the semiconductor device according to Third Embodiment, formation of the third mask M3 is not required.

Since in the method of manufacturing the semiconductor device according to Third Embodiment, the first etching step S5 is performed using the second mask M2 having an opening only in the second transistor region AR3, an increase in the first recess depth does not occur by the first etching step S5. The first recess depth increases in the second etching step S8 so that the first recess depth becomes larger than the second recess depth also by the method of manufacturing the semiconductor device according to Third Embodiment. In order to make the first recess depth larger than the third recess depth in the method of manufacturing the semiconductor device according to Third Embodiment, it is preferred to make the etching time in the second etching step S8 longer than that in the first etching step S5.

Advantage of the Method of Manufacturing the Semiconductor Device According to Third Embodiment The advantage of the semiconductor device according to Third Embodiment will next be described.

The method of manufacturing the semiconductor device according to Third Embodiment does not need the third mask M3. The method of manufacturing the semiconductor device according to Third Embodiment therefore makes it possible to reduce the number of masks necessary for manufacturing steps and therefore to reduce a manufacturing cost.

The invention made by the present inventors has been described in detail based on some embodiments. It is needless to say that the invention is not limited by the above embodiments but can be changed in various ways without departing from the gist of the invention.

What is claimed is:

1. A method of manufacturing a semiconductor device, the method comprising the steps of:
(a) providing an SOI substrate including a first region and a second region,
wherein the first region of the SOI substrate includes:
a semiconductor substrate;
an insulating layer on the semiconductor substrate;
a memory transistor region in which a memory transistor is to be formed; and
a first element isolation film that surrounds the memory transistor region, the first element isolation film having a first upper surface, a first bottom surface opposite the first upper surface, and a first side surface between the first upper surface and the first bottom surface,
wherein the second region of the SOI substrate includes:
the semiconductor substrate;
the insulating layer on the semiconductor substrate;
a semiconductor layer on the insulating layer;
an insulating film on the semiconductor layer;
a first transistor region in which a first transistor is to be formed; and
a second element isolation film that surrounds the first transistor region, the second element isolation film having a second upper surface, a second bottom surface opposite the second upper surface, and a second side surface between the second upper surface and the second bottom surface, and
wherein, in cross-sectional view, the first upper surface of the first element isolation film is located at a lower height than the second upper surface of the second element isolation film;
(b) after the (a), forming a third mask having an opening over the memory transistor region and also covering the first transistor region and carrying out first wet etching using the third mask, wherein the first wet etching removes i) the insulating layer in the memory transistor region of the first region of the SOI substrate and ii) a part of the first element isolation film of the first region of the SOI substrate so that a first recess is formed at an end portion of the first element isolation film of the first region of the SOI substrate, the first recess extending from the first upper surface to the first side surface of the first element isolation film such that a first point where the first recess meets the first side surface is disposed to be higher than a first lowest point of the first recess; and
(c) after the (b), forming a fifth mask having an opening over the first transistor region and also covering the memory transistor region, and carrying out third wet etching using the fifth mask, wherein the third wet etching removes i) the insulating film in the first transistor region of the second region of the SOI substrate and ii) a part of the second element isolation film of the second region of the SOI substrate so that a second recess is formed at an end portion of the second element isolation film of the second region of the SOI substrate, the second recess extending from the second upper surface to the second side surface of the second element isolation film such that a second point where the second recess meets the second side surface is disposed to be higher than a second lowest point of the second recess,
wherein, after the (c), a first depth from the first point to the first lowest point of the first recess is larger than a depth from the second point to the second lowest point of the second recess.

2. The method of manufacturing a semiconductor device according to claim 1,
wherein the first region further includes 1) a second transistor region in which a second transistor is to be formed, and 2) a third element isolation film that surrounds the second transistor region,
wherein the third element isolation film has a third upper surface, a third bottom surface opposite the third upper surface, and a third side surface between the third upper surface and the third bottom surface,
wherein the third mask further has an opening situated over the second transistor region, and wherein, in the (b), the first wet etching removes i) the insulating layer in the memory transistor region, ii) the insulating layer in the second transistor region, iii) a part of the first element isolation film, and iv) a part of and partially removes the third element isolation film so that a third recess is formed at an end portion of the third element isolation film, the third recess extending from the third upper surface to the third side surface such that a third point where the third recess meets the third side surface is disposed to be higher than a third lowest point of the third recess.

3. The method according to claim 2, further comprising the steps of:
 (d) after the (b) and before the (c), forming a fourth gate insulating film in the memory transistor region;
 (e) after the (d) and before (c), forming a fourth mask having an opening over the memory transistor region and also covering the first transistor region and the second transistor region, and carrying out a third channel implantation to the memory transistor region using the fourth mask; and
 (f) after the (e) and before the (c), carrying out second wet etching using the fourth mask, wherein the second wet etching removes i) the fourth gate insulating film in the memory transistor region and ii) a part of the first element isolation film.

4. The method according to claim 2, further comprising the steps of:
 forming a first mask having an opening over the memory transistor region and the second transistor region and also covering the first transistor region,
 carrying out a first well implantation into the memory transistor region and the second transistor region using the first mask;
 forming a second mask having an opening over the second transistor region and also covering the memory transistor region and the first transistor region; and
 carrying out a first channel implantation into the second transistor region using the second mask.

5. The method according to claim 2, further comprising the steps of:
 carrying out a first well implantation into the memory transistor region and the second transistor region using the third mask; and
 carrying out a first channel implantation into the second transistor region using the third mask and a second channel implantation into the memory transistor region using the third mask.

6. The method according to claim 1,
 wherein time for the third wet etching is shorter than time for the first wet etching.

7. The method according to claim 6, further comprising the step of:
 after the third wet etching, washing the first transistor region with a chemical solution capable of etching the semiconductor layer.

* * * * *